United States Patent
Lu et al.

(10) Patent No.: US 10,762,973 B1
(45) Date of Patent: Sep. 1, 2020

(54) SUPPRESSING PROGRAM DISTURB DURING PROGRAM RECOVERY IN MEMORY DEVICE

(71) Applicant: SanDisk Technologies LLC, Addison, TX (US)

(72) Inventors: Ching-Huang Lu, Fremont, CA (US); Zhengyi Zhang, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/408,975

(22) Filed: May 10, 2019

(51) Int. Cl.
  *G11C 16/34* (2006.01)
  *G11C 16/24* (2006.01)
  *G11C 16/16* (2006.01)
  *G11C 16/08* (2006.01)

(52) U.S. Cl.
  CPC .......... *G11C 16/3431* (2013.01); *G11C 16/08* (2013.01); *G11C 16/16* (2013.01); *G11C 16/24* (2013.01); *G11C 16/3459* (2013.01)

(58) Field of Classification Search
  CPC . G11C 16/10; G11C 16/3418; G11C 16/3422; G11C 16/3459; G11C 16/0483
  See application file for complete search history.

(56) References Cited

U.S. PATENT DOCUMENTS

| | | | |
|---|---|---|---|
| 7,623,386 B2 * | 11/2009 | Dong | G11C 11/5628 365/185.02 |
| 8,174,902 B2 | 5/2012 | Lee et al. | |
| 9,087,601 B2 | 7/2015 | Dutta et al. | |
| 9,543,020 B2 * | 1/2017 | Suzuki | G11C 16/10 |
| 9,564,229 B2 | 2/2017 | Choi et al. | |
| 9,620,233 B1 | 4/2017 | Dong et al. | |
| 9,761,320 B1 | 9/2017 | Chen et al. | |
| 9,805,807 B2 * | 10/2017 | Lee | G11C 16/16 |
| 10,410,728 B2 * | 9/2019 | Shim | G11C 16/3418 |
| 10,629,267 B2 * | 4/2020 | Lee | G11C 16/0483 |
| 2006/0239069 A1 * | 10/2006 | Kamigaichi | G11C 16/0483 365/185.01 |
| 2018/0190363 A1 | 7/2018 | Lee | |
| 2019/0096488 A1 | 3/2019 | Joe et al. | |

OTHER PUBLICATIONS

International Search Report & The Written Opinion of the International Searching Authority dated Apr. 7, 2020, International Application No. PCT/US2019/067009.

* cited by examiner

*Primary Examiner* — Vanthu T Nguyen
(74) *Attorney, Agent, or Firm* — Vierra Magen Marcus LLP

(57) ABSTRACT

Program disturb is suppressed during a program recovery phase of a program operation in a memory device. The duration of the recovery phase can be increased when the risk of program disturb is greater due to factors such as temperature, the position of the selected word line, the number of program-erase cycles and the program pulse magnitude. In other approaches, the risk of program disturb is reduced by providing an early ramp down of the voltages of the drain-side word line relative to a ramp down of the voltages of the source-side word lines, providing an early ramp down of the bit line voltage of the inhibited NAND strings relative to the ramp down of the select gate voltage or setting a lower recovery voltage for the source-side word lines relative to the recovery voltage of the drain-side word lines.

23 Claims, 23 Drawing Sheets

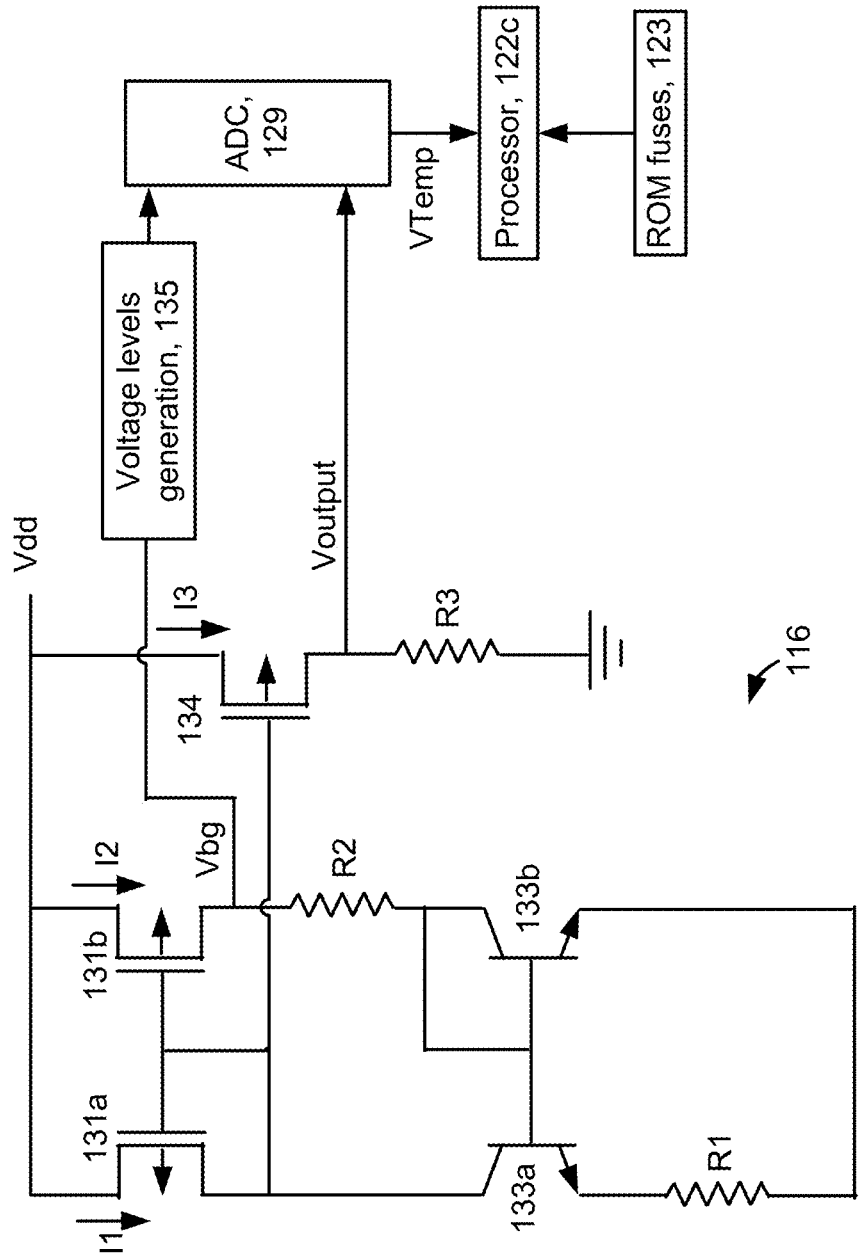

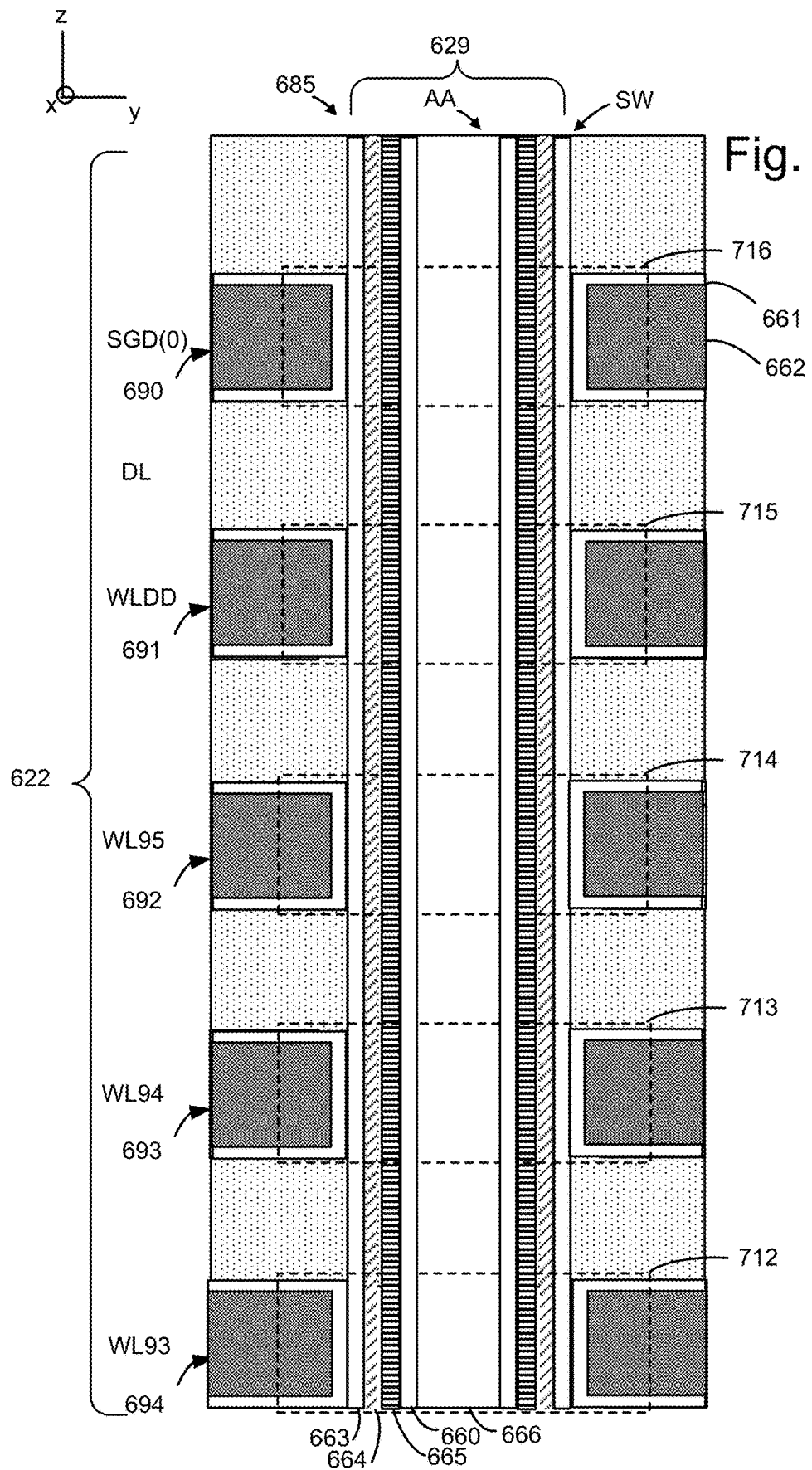

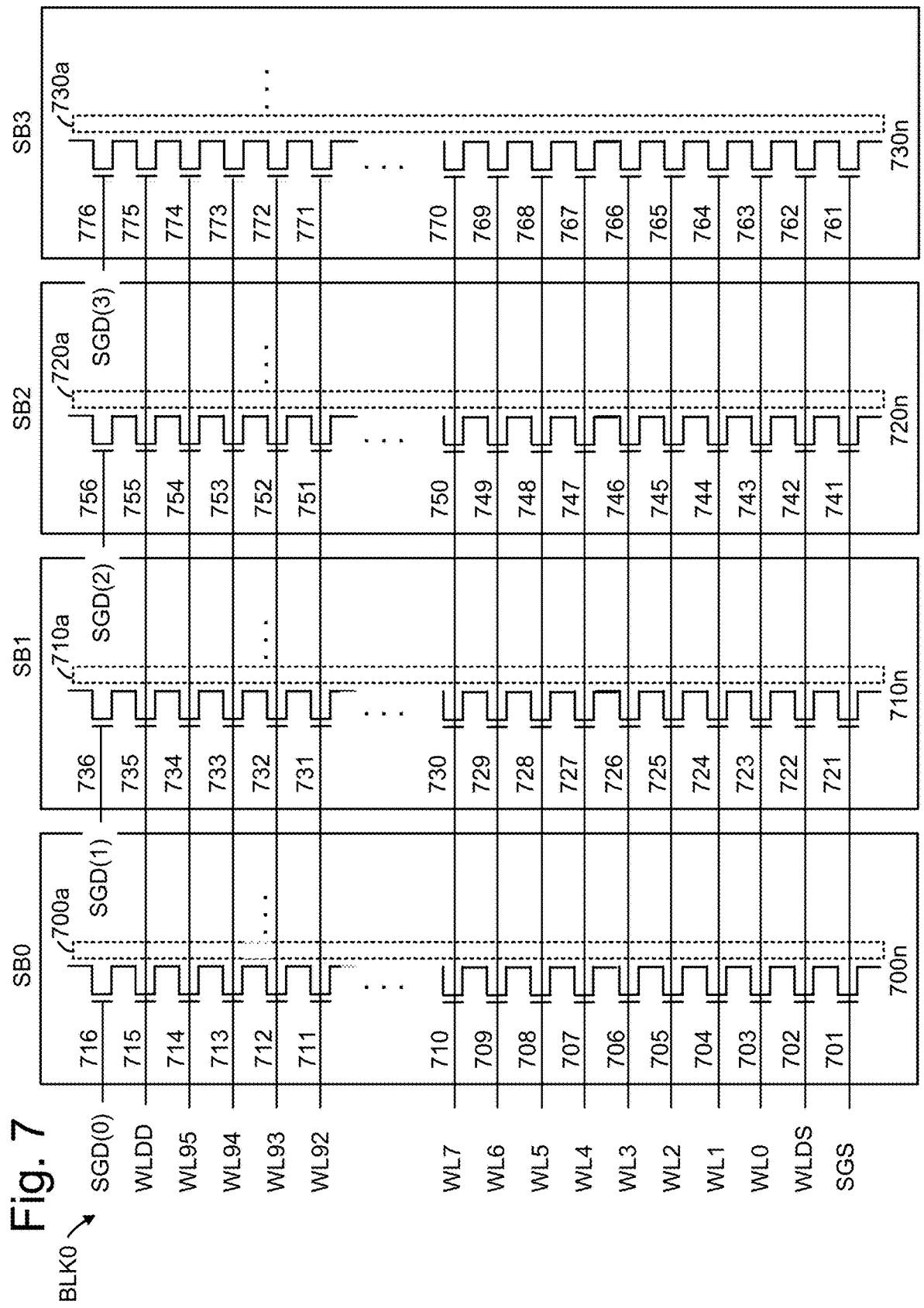

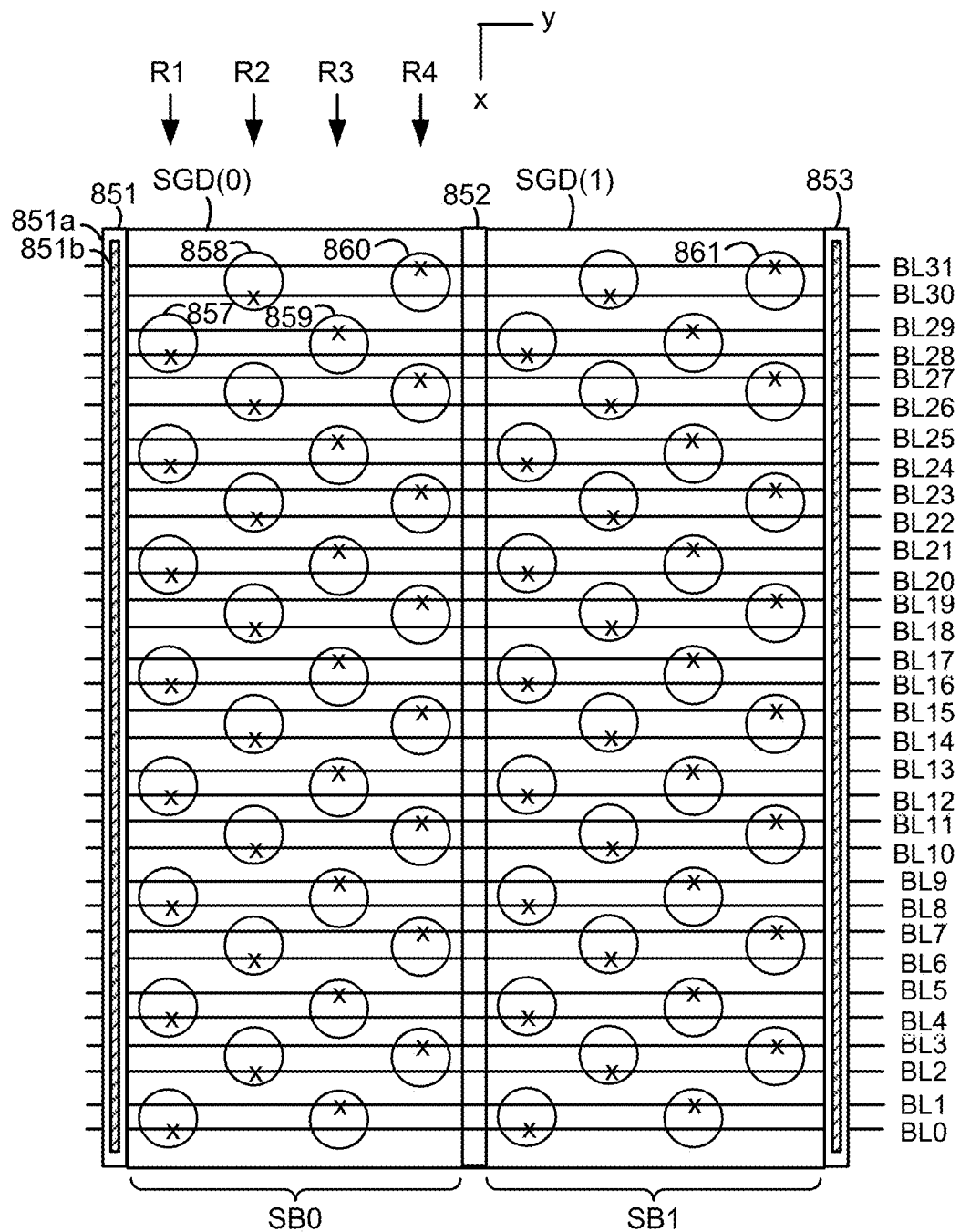

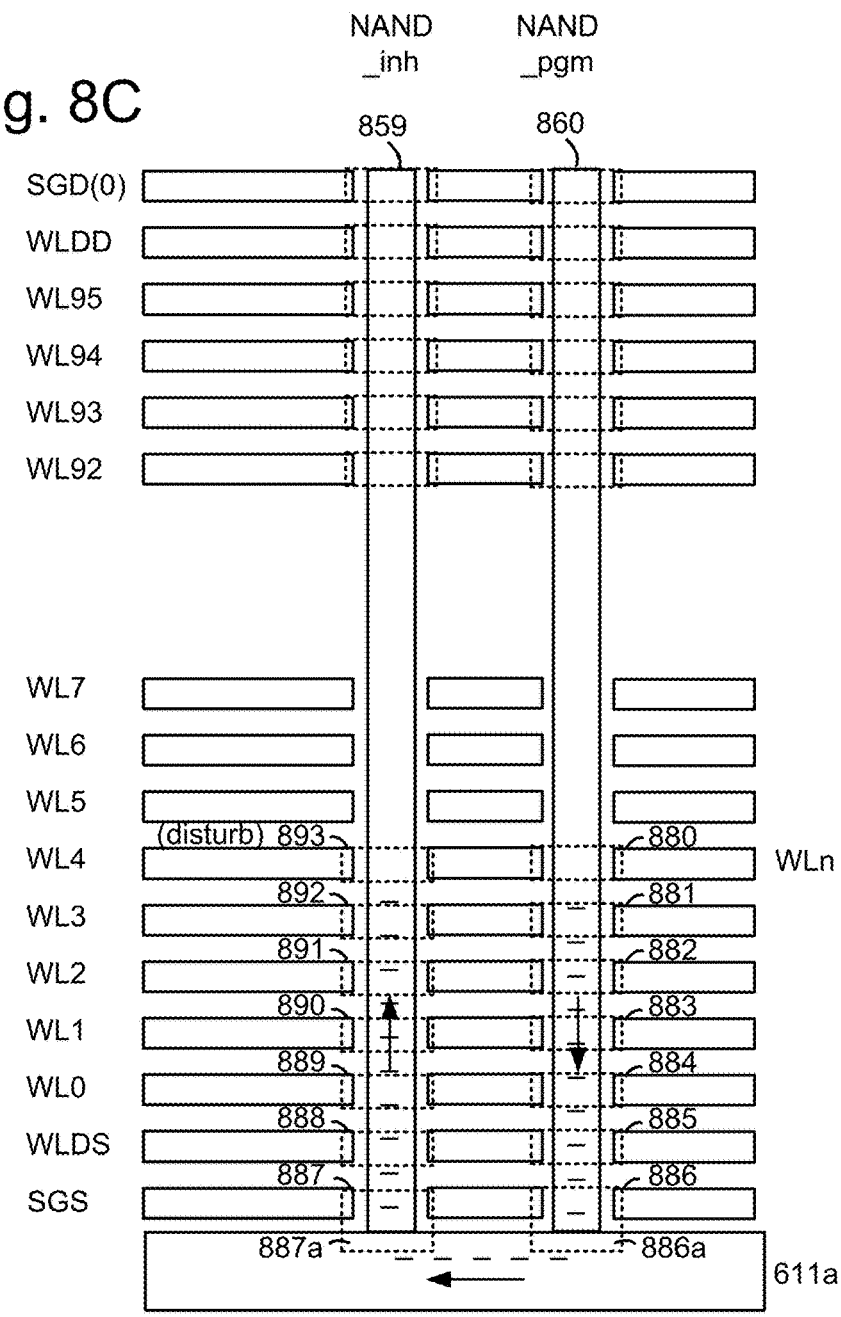
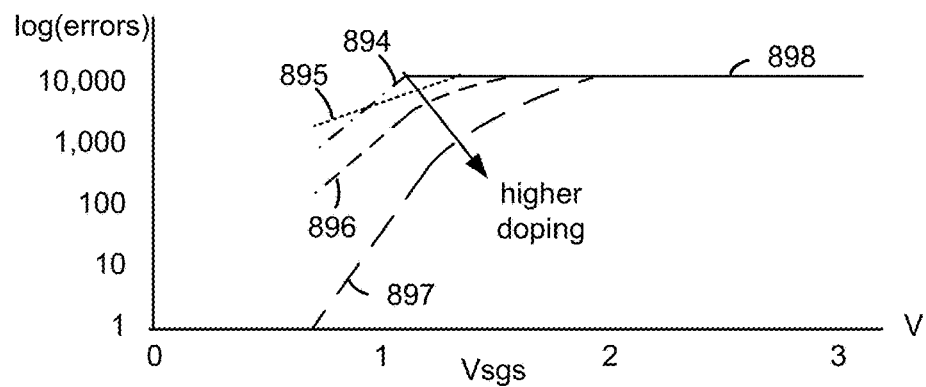

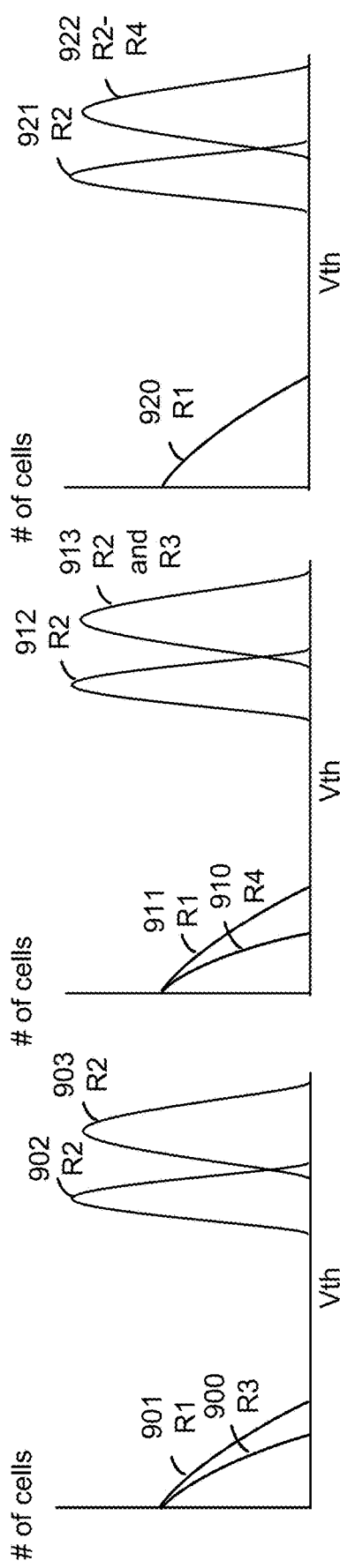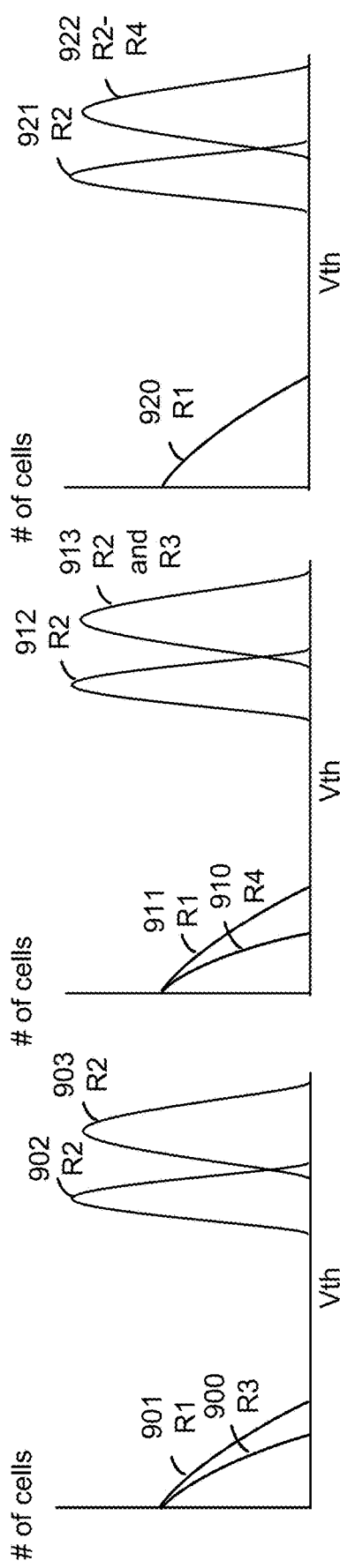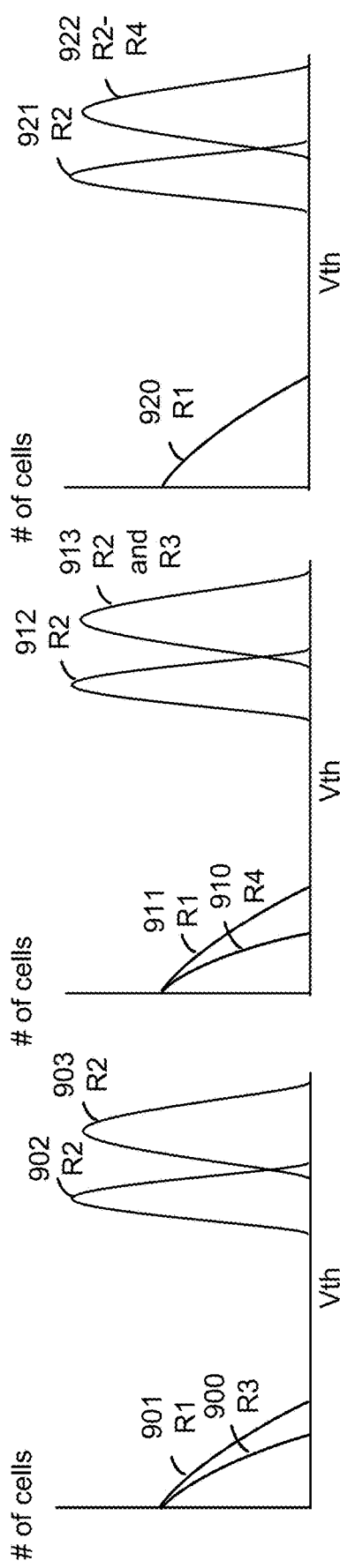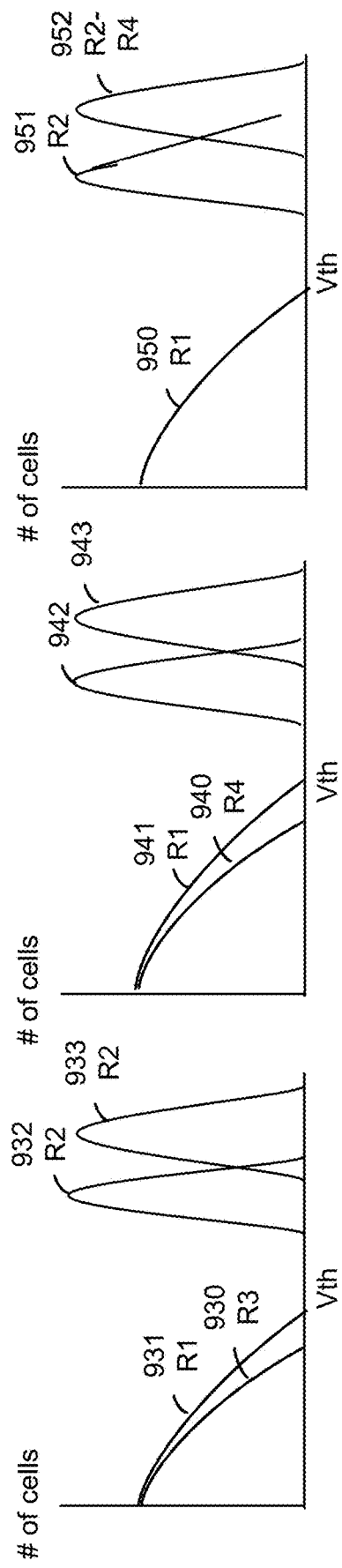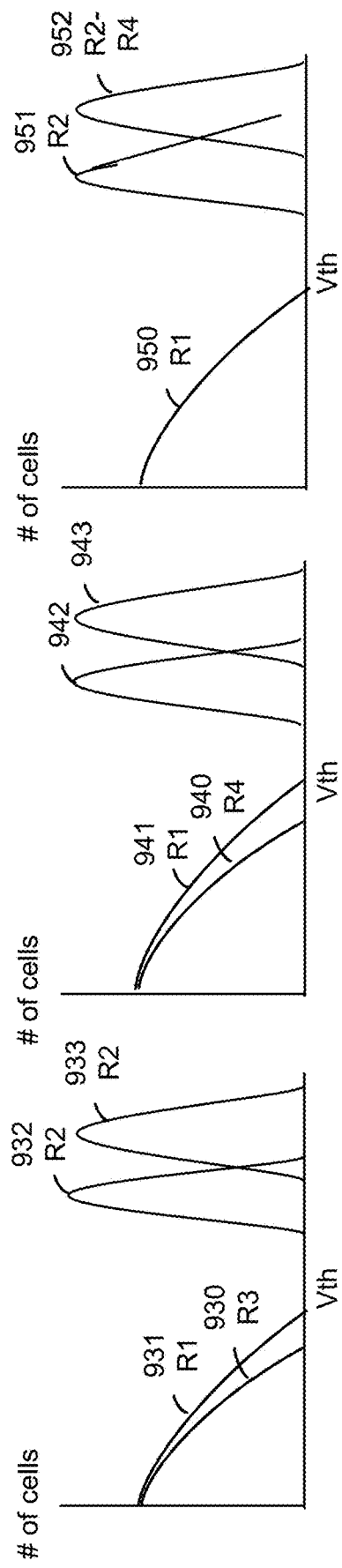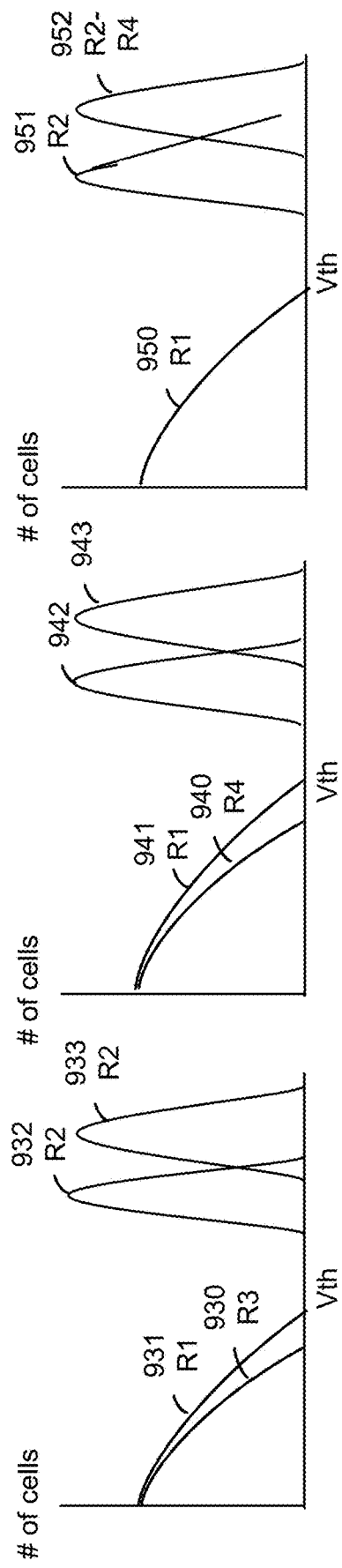

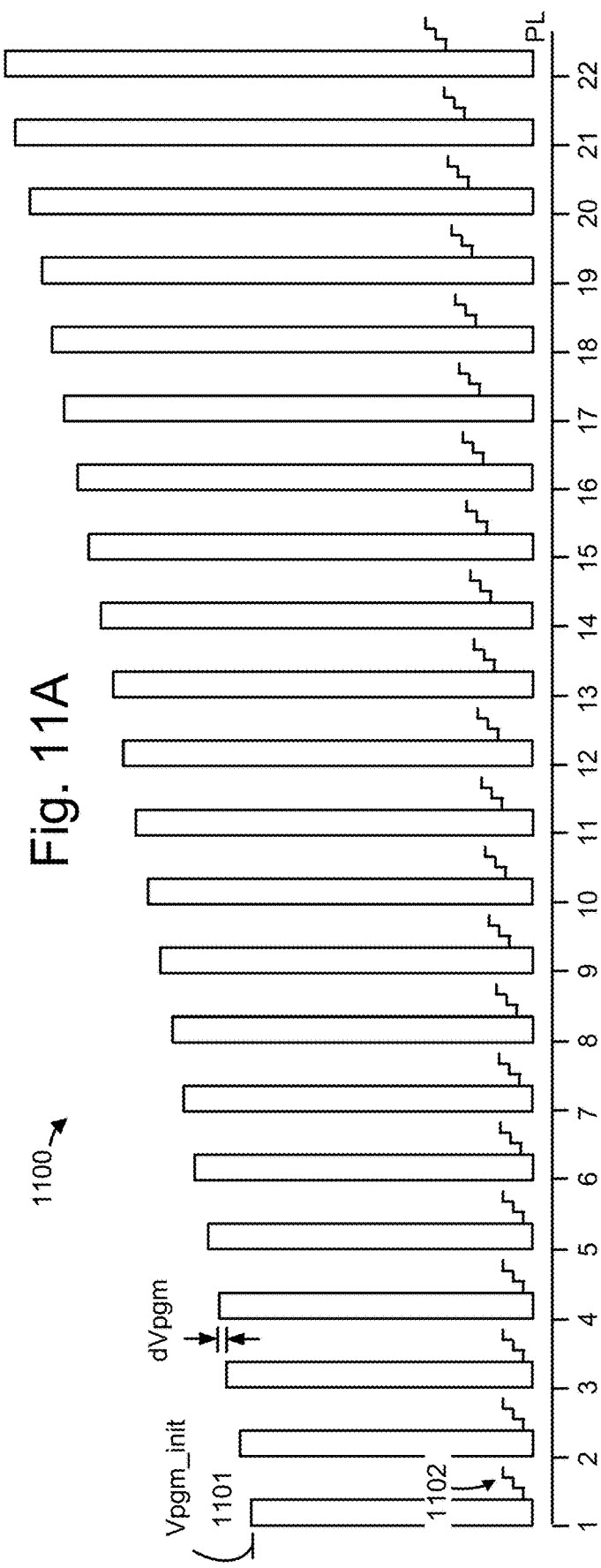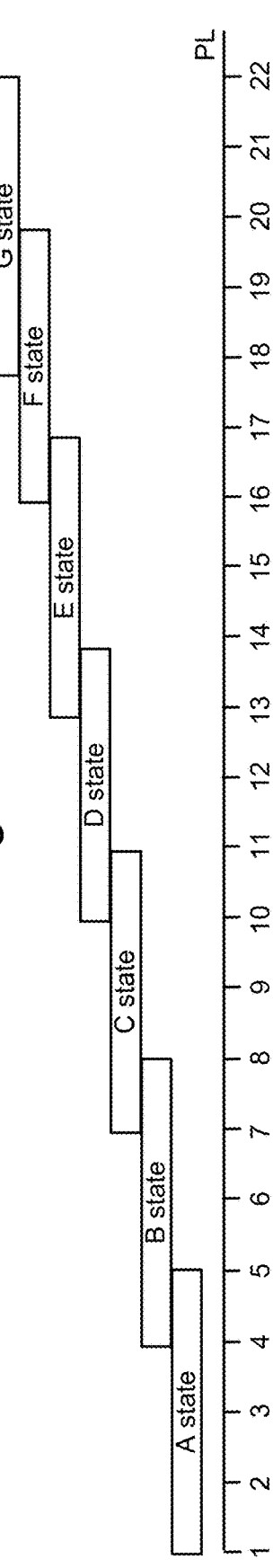

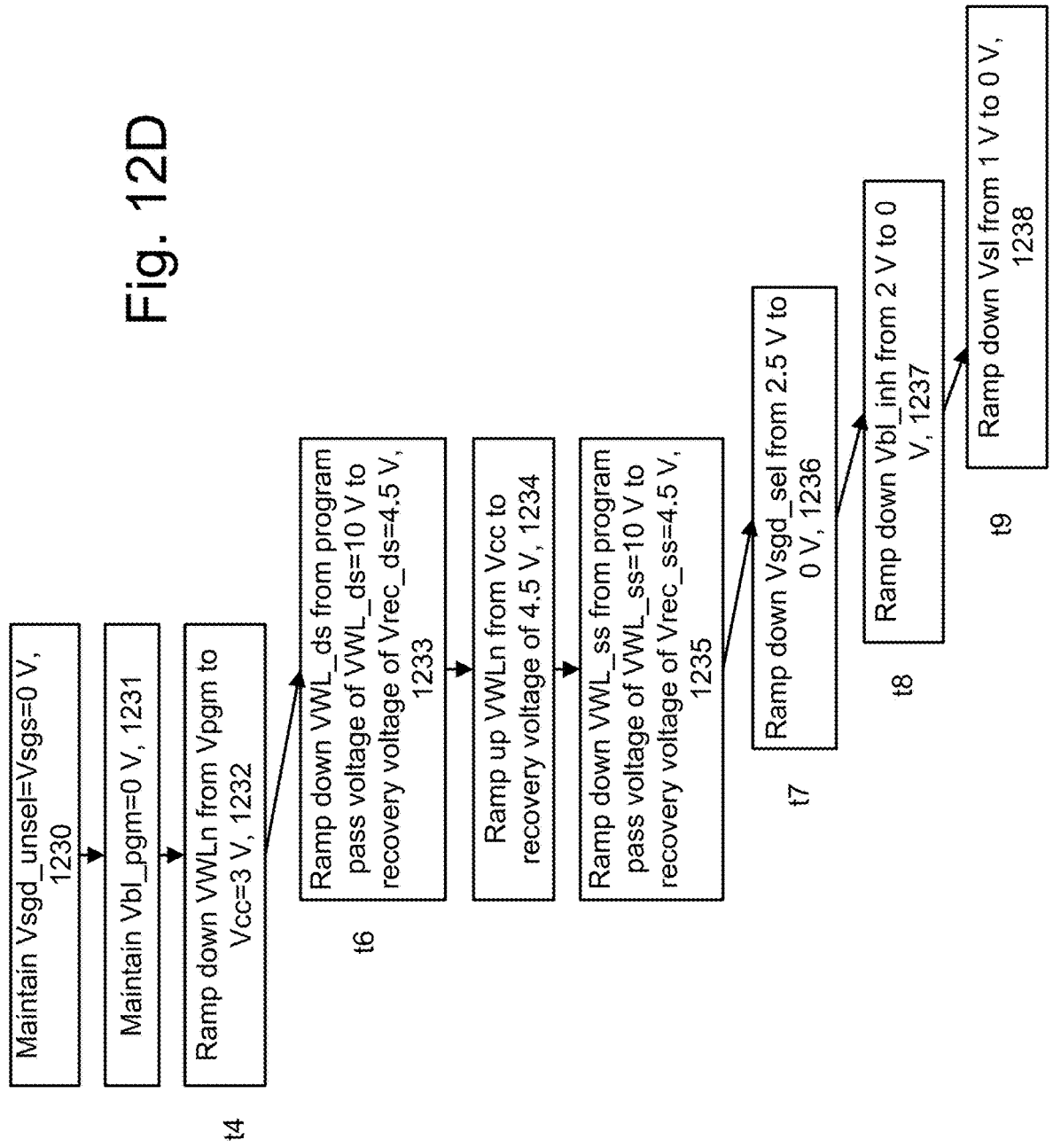

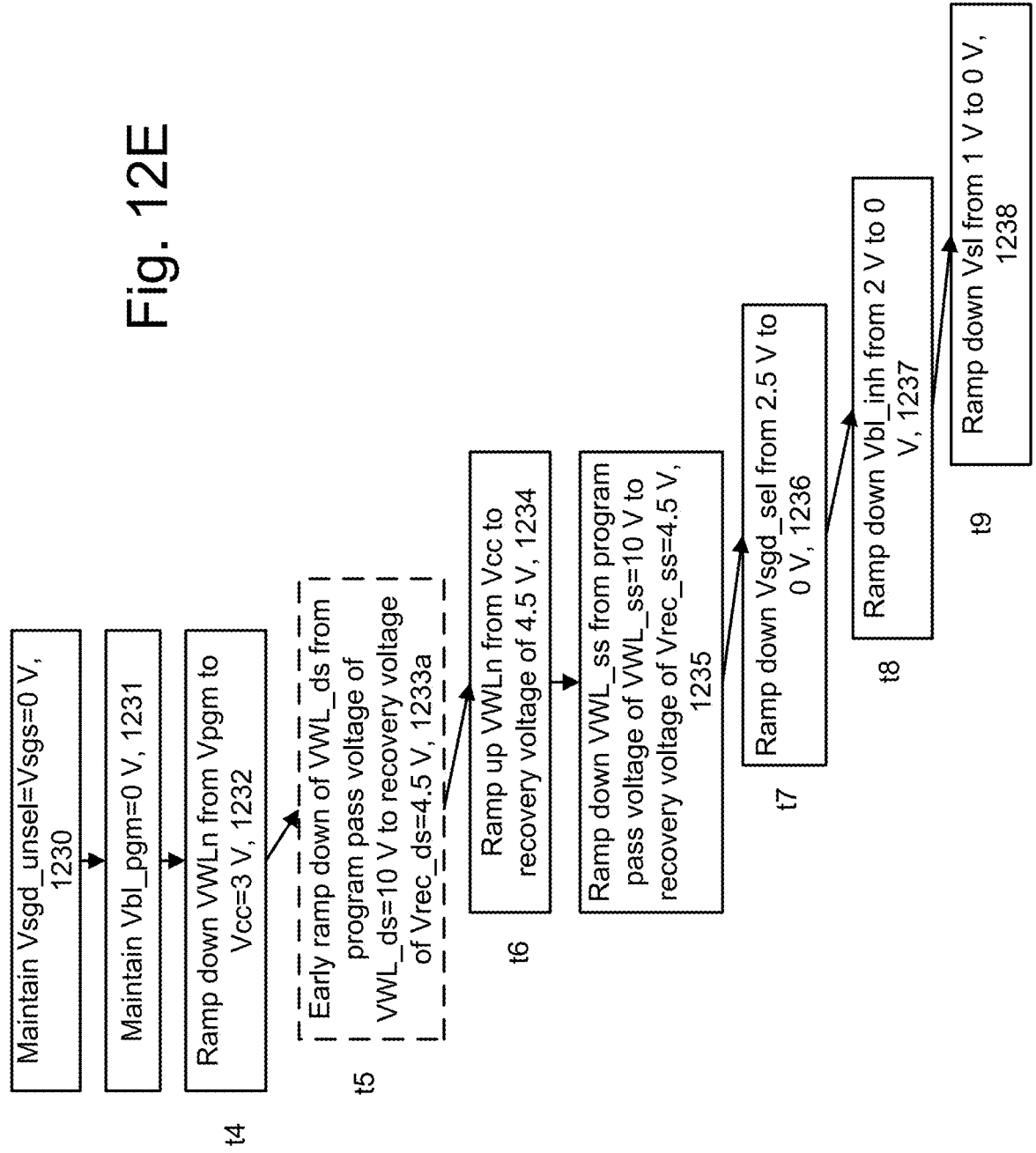

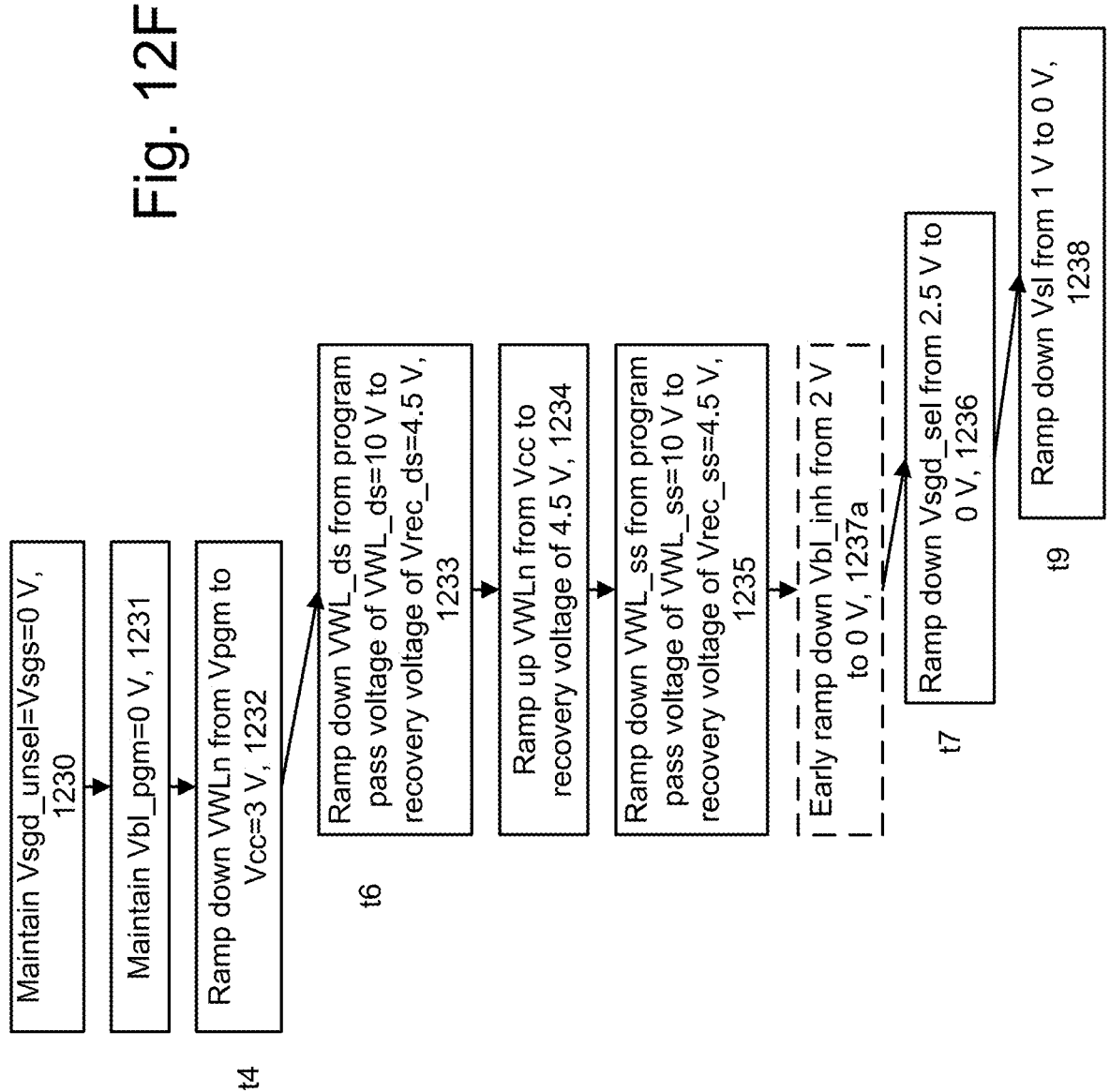

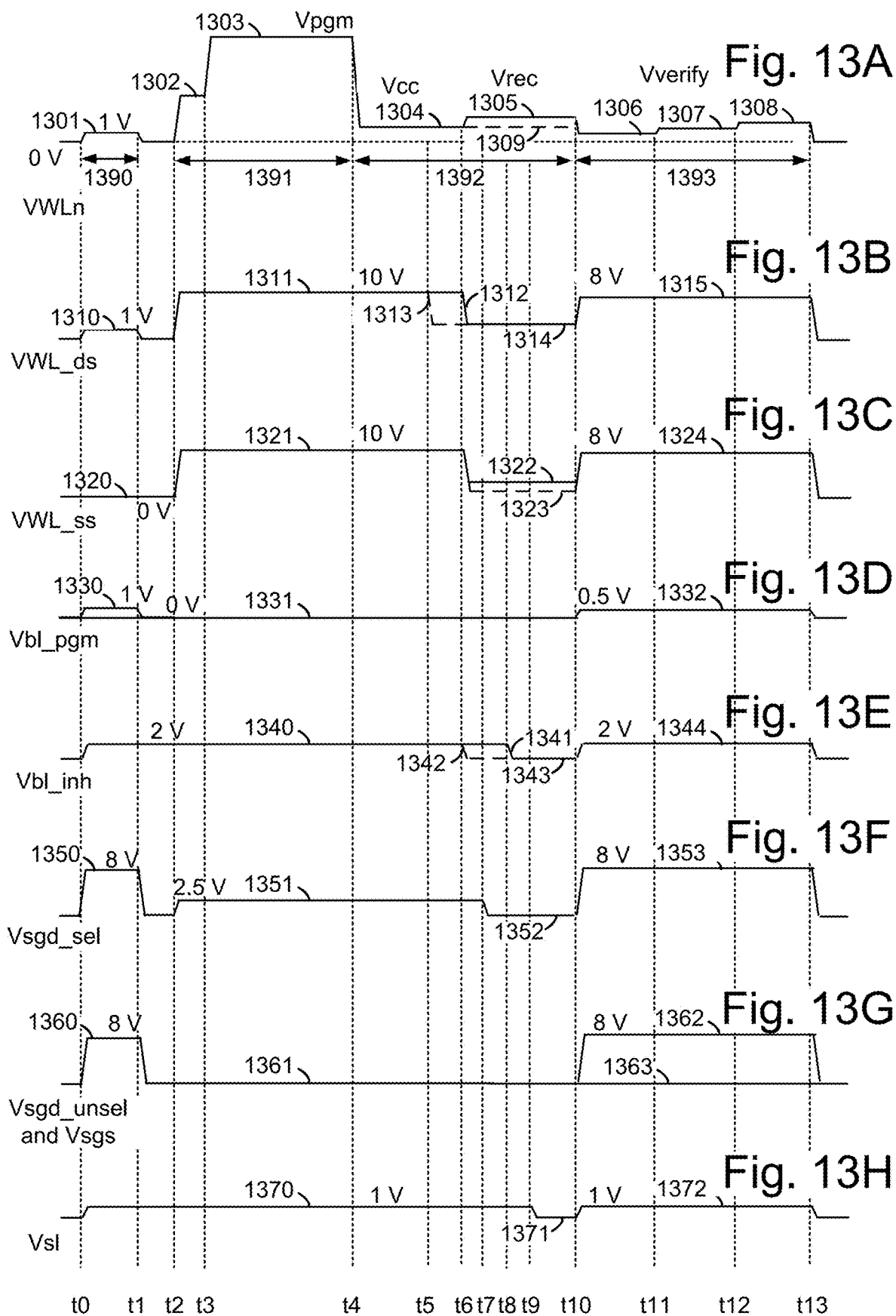

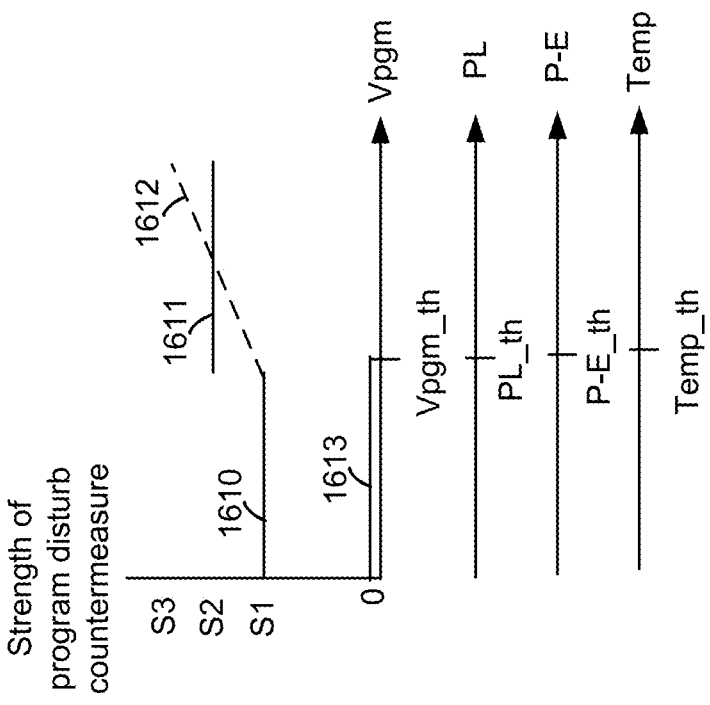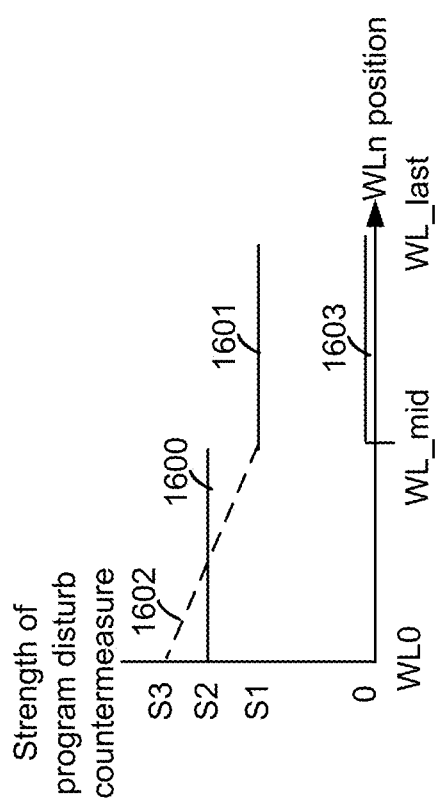

SUPPRESSING PROGRAM DISTURB DURING PROGRAM RECOVERY IN MEMORY DEVICE

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in series, in NAND strings (e.g., NAND chains), for instance, where select gate transistors are provided at the ends of a NAND string to selectively connect a channel of the NAND string to a source line or bit line. However, various challenges are presented in operating such memory devices.

BRIEF DESCRIPTION OF THE DRAWINGS

FIG. 1B depicts an example of the temperature-sensing circuit 116 of FIG. 1A.

FIG. 6B depicts a close-up view of the region 622 of the stack of FIG. 6A.

FIG. 7 depicts an example view of NAND strings in a block BLK0 which is consistent with FIGS. 4 and 6A.

FIG. 8B depicts an example top view of the portion of block BLK0 of FIG. 8A.

FIG. 8C depicts the example NAND strings 859 and 860 of rows R3 and R4, respectively, in FIG. 8B, showing the movement of electrons which results in program disturb of a memory cell 893 of WL4.

FIG. 8D depicts a plot of a number of read errors versus Vsgs for different Vth levels of the SGS transistor 886.

FIG. 9A depicts a plot of Vth distributions for Er-state memory cells in rows 1 and 3 of the sub-block SB0 of FIG. 8B due to program disturb caused by programming memory cells of row 2 to the F and G states, using a long ramp down time for VWLunsel to transition from Vprogram pass to Vrecovery.

FIG. 9B depicts a plot of Vth distributions for Er-state memory cells in rows 1 and 4 of the sub-block SB0 of FIG. 8B due to program disturb caused by programming memory cells of row 2 to the F and G states, and by programming memory cells of row 3 to the G state, using a long ramp down time for VWLunsel to transition from Vprogram pass to Vrecovery.

FIG. 9C depicts a plot of Vth distributions for Er-state memory cells in row 1 of the sub-block SB0 of FIG. 8B due to program disturb caused by programming memory cells of row 2 to the F and G states, and by programming memory cells of rows 3 and 4 to the G state, using a long ramp down time for VWLunsel to transition from Vprogram pass to Vrecovery.

FIG. 9D depicts a plot of Vth distributions comparable to those in FIG. 9A except a short ramp down time is used for VWLunsel to transition from Vprogram pass to Vrecovery.

FIG. 9E depicts a plot of Vth distributions comparable to those in FIG. 9B except a short ramp down time is used for VWLunsel to transition from Vprogram pass to Vrecovery.

FIG. 9F depicts a plot of Vth distributions comparable to those in FIG. 9C except a short ramp down time is used for VWLunsel to transition from Vprogram pass to Vrecovery.

FIG. 11A depicts an example voltage signal used in a program operation, consistent with FIG. 10A.

FIG. 11B depicts an example of verify voltages used in different program loops of FIG. 11A.

FIG. 12D depicts a flowchart of a first example process for performing the recovery phase of step 1203 of FIG. 12A.

FIG. 12E depicts a flowchart of a second example process for performing the recovery phase of step 1203 of FIG. 12A.

FIG. 12F depicts a flowchart of a third example process for performing the recovery phase of step 1203 of FIG. 12A.

FIG. 13A-13H depict examples of voltage signals which can be used in a program operation, consistent with FIG. 12A-12H.

FIG. 13A depicts voltages applied to a selected word line, WLn.

FIG. 13B depicts voltages applied to drain-side word line of WLn.

FIG. 13C depicts voltages applied to source-side word line of WLn.

FIG. 13D depicts voltages applied to bit lines of programmed NAND strings.

FIG. 13E depicts voltages applied to bit lines of inhibited NAND strings.

FIG. 13F depicts voltages applied to SGD transistors of a selected sub-block.

FIG. 13G depicts voltages applied to SGD transistors of unselected sub-blocks and to SGS transistors.

FIG. 13H depicts a voltage applied to a source line.

FIG. 16A depicts a plot of a strength of a program disturb countermeasure as a function of WLn position.

FIG. 16B depicts a plot of a strength of a program disturb countermeasure as a function of Vpgm, program loop (PL) number, P-E cycles and temperature.

DETAILED DESCRIPTION

Figure 1A:
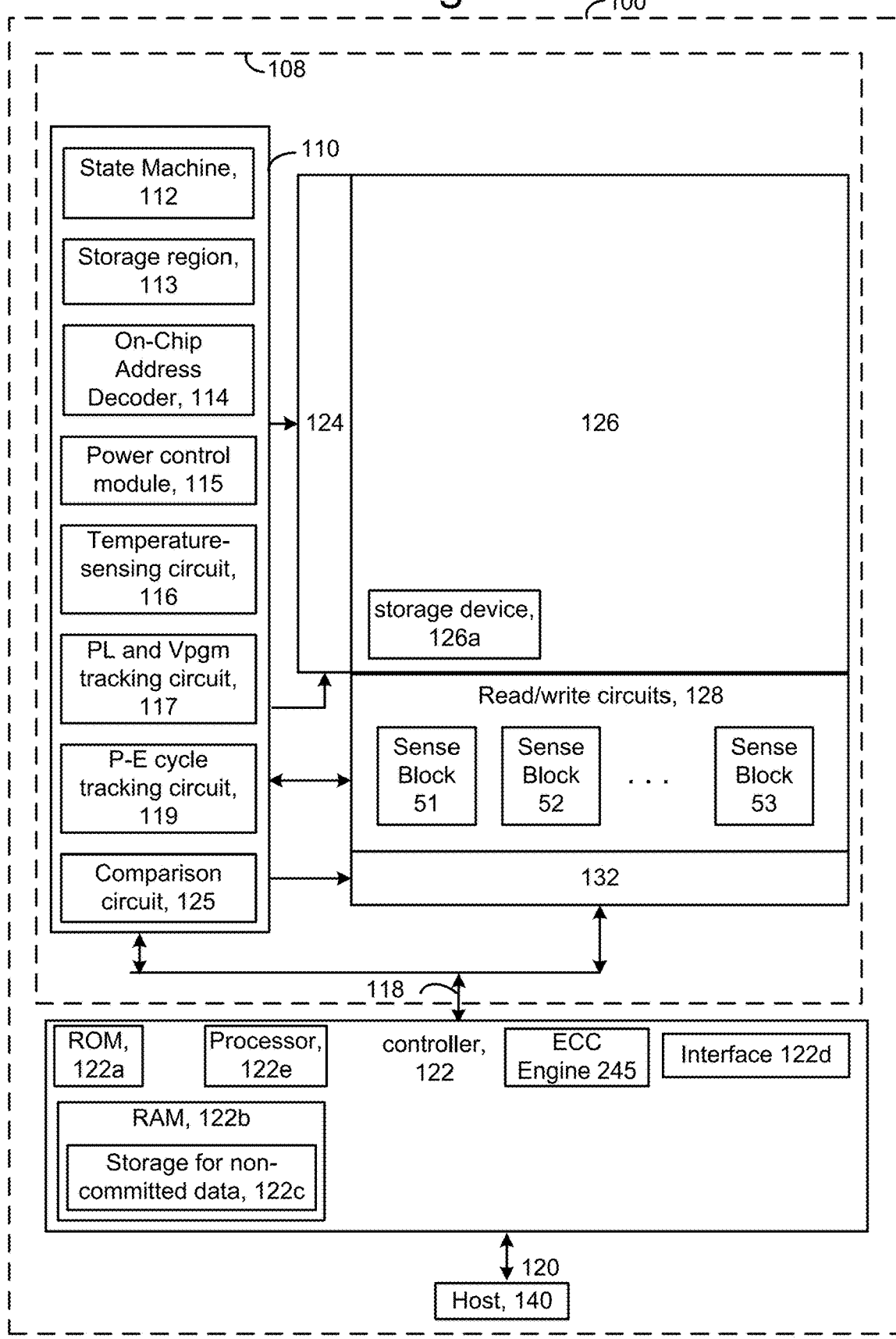
FIG. 1A is a block diagram of an example memory device.

Apparatuses and techniques are described for reducing program disturb in a memory device during the recovery phase of a program loop.

In some memory devices, memory cells are joined to one another such as in NAND strings in a block or sub-block. Each NAND string comprises a number of memory cells connected in series between one or more drain-end select gate transistors (referred to as SGD transistors), on a drain-end of the NAND string which is connected to a bit line, and one or more source-end select gate transistors (referred to as SGS transistors), on a source-end of the NAND string or other memory string or set of connected memory cells, which is connected to a source line. Further, the memory cells can be arranged with a common control gate line (e.g., word line) which acts a control gate. A set of word lines extends from the source-side of a block to the drain-side of a block. Memory cells can be connected in other types of strings and in other ways as well.

In a 3D memory structure, the memory cells may be arranged in vertical NAND strings in a stack, where the stack comprises alternating conductive and dielectric layers. The conductive layers act as word lines which are connected to the memory cells. Each NAND string may have the shape of a pillar which intersects with the word lines to form the memory cells. In a 2D memory structure, the memory cells may be arranged in horizontal NAND strings on a substrate.

After a block of memory cells is erased in an erase operation, programming can occur. During a programming operation, the memory cells are programmed according to a word line programming order. For example, the programming may start at the word line at the source-side of the block and proceed to the word line at the drain-side of the block, one word line at a time. A programming operation may include one or more sets of increasing program voltages or pulses which are applied to a word line in respective program loops or program-verify iterations, such as depicted in FIGS. 11A and 11B. Verify tests may be performed after each program voltage to determine whether the memory cells have completed programming. When programming is completed for a memory cell, it can be locked out from further programming while programming continues for other memory cells in subsequent program loops.

A program loop can include a pre-charge phase, a program phase, a recovery phase and a verify phase, as depicted in FIG. 13A-13H.

Each memory cell may be associated with a data state according to write data in a program command. Based on its data state, a memory cell will either remain in the erased (Er) state or be programmed to a programmed data state. For example, in a one bit per cell memory device, there are two data states including the erased state and the programmed state. In a two-bit per cell memory device, there are four data states including the erased state and three programmed data states referred to as the A, B and C data states. In a three-bit per cell memory device, there are eight data states including the erased state and seven programmed data states referred to as the A, B, C, D, E, F and G data states (see FIG. 10A). In a four-bit per cell memory device, there are sixteen data states including the erased state S0 and fifteen programmed data states S1-S15. Each data state can be represented by a range of threshold voltages (Vth) in the memory cells.

After the memory cells are programmed, the data can be read back in a read operation. A read operation can involve applying a series of read voltages to a word line while sensing circuitry determines whether cells connected to the word line are in a conductive (turned on) or non-conductive (turned off) state. If a cell is in a non-conductive state, the Vth of the memory cell exceeds the read voltage. The read voltages are set at levels which are expected to be between the threshold voltage levels of adjacent data states. Moreover, during the read operation, the voltages of the unselected word lines are ramped up to a read pass level or turn on level which is high enough to place the unselected memory cells in a strongly conductive state, to avoid interfering with the sensing of the selected memory cells. A word line which is being programmed or read is referred to as a selected word line, WLn.

However, program disturb can occur in the recovery phase of a program loop. In particular, when the voltages of the selected and unselected word lines and the source line ramp down, a source-side injection (SSI) type of program disturb can occur in inhibited NAND strings. One approach is to increase the duration of the recovery phase. However, this increases the overall program time.

Techniques provided herein address the above and other issues by reducing SSI program disturb and improving write performance. In one approach, the duration of the recovery phase is increased when the risk of program disturb is greater. The risk can be based on factors such as temperature, WLn position, the number of program-erase (P-E) cycles and the program pulse magnitude or program loop number. In another approach, the risk of program disturb is reduced by providing an early ramp down of the voltages of the drain-side word line compared to the voltages of the source-side word lines. In another approach, the risk of program disturb is reduced by providing an early ramp down of the bit line voltages of the inhibited NAND strings compared to the ramp down of the SGD voltage. In another approach, the risk of program disturb is reduced by setting a lower recovery voltage for the source-side word lines compared to the recovery voltage of the drain-side word lines. The above approaches can be used separately or combined.

These and other features are discussed further below.

FIG. 1A is a block diagram of an example memory device. The memory device 100, such as a non-volatile storage system, may include one or more memory die 108. The memory die 108, or chip, includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . 53 (sensing circuitry) and allow a page of memory cells to be read or programmed in parallel. Typically a controller 122 is included in the same memory device 100 (e.g., a removable storage card) as the one or more memory die 108. The controller may be separate from the memory die. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine, an on-chip address decoder 114, a power control module 115 (power control circuit), a temperature-sensing circuit 116, a program loop (PL) and Vpgm tracking circuit 117, a P-E cycle tracking circuit 119 and a comparison circuit 125. A storage region 113 may be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control module 115 controls the power and voltages supplied to the word lines, select gate lines, bit lines and source lines during memory operations. It can include drivers for word lines, SGS and SGD transistors and source lines. See also FIG. 3. The sense blocks can include bit line drivers, in one approach. The temperature-sensing circuit 116 can detect a temperature of the memory device at the time of a program operation, for example, for use by the comparison circuit. The program loop and Vpgm tracking circuit 117 can detect when the current program loop number and Vpgm reach a threshold. The P-E cycle tracking circuit 119 can track a number of P-E cycles which are accumulated over time by a block or other set of memory cells.

The comparison circuit 125 can store threshold values of temperature (Temp_th), program voltage (Vpgm_th), program loop number (PL_th), P-E cycles (P-E_th) and word line position (WLn_th), and compare these threshold values to the current temperature, program voltage, program loop number, P-E cycles and word line position, respectively, to determine a risk of SSI type of program disturb and a corresponding countermeasure. The comparison circuit can receive the current temperature from the circuit 116, the current program voltage and program loop number from the circuit 117, the current number of P-E cycles from the circuit 119 and the current word line position from the state machine 112 and make a decision as to the strength of a program disturb countermeasure, or whether to use a program disturb countermeasure, consistent with FIGS. 16A and 16B.

See FIG. 1B for an example implementation of the temperature-sensing circuit. The temperature-sensing circuit, program loop and Vpgm tracking circuit, P-E cycle tracking circuit, and comparison circuit may include hardware, software and/or firmware for performing the processes described herein.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control module 115, temperature-sensing circuit 116, program loop and Vpgm tracking circuit 117, P-E cycle tracking circuit 119, comparison circuit 125, sense blocks 51, 52, ..., 53, read/write circuits 128, controller 122, and so forth.

The off-chip controller 122 (which in one embodiment is an electrical circuit) may comprise a processor 122e, storage devices (memory) such as ROM 122a and RAM 122b and an error-correction code (ECC) engine 245. The ECC engine can correct a number of read errors. The RAM 122b can be a DRAM which includes a storage location 122c for non-committed data. During programming, a copy of the data to be programmed is stored in the storage location 122c until the programming is successfully completed. In response to the successful completion, the data is erased from the storage location and is committed or released to the block of memory cells. The storage location 122c may store one or more word lines of data.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122e fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below.

A control circuit can be configured to execute the instructions to perform the functions described herein.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read-only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

FIG. 1B depicts an example of the temperature-sensing circuit 116 of FIG. 1A. The circuit includes pMOSFETs 131a, 131b and 134, bipolar transistors 133a and 133b and resistors R1, R2 and R3. I1, I2 and I3 denote currents. Voutput is a temperature-based output voltage provided to an analog-to-digital (ADC) converter 129. Vbg is a temperature-independent voltage. A voltage level generation circuit 135 uses Vbg to set a number of voltage levels. For example, a reference voltage may be divided down into several levels by a resistor divider circuit.

The ADC compares Voutput to the voltage levels and selects a closest match among the voltage levels, outputting a corresponding digital value (VTemp) to the processor 122e. This is data indicating a temperature of the memory device. ROM fuses 123 store data which correlates the matching voltage level to a temperature, in one approach. The processor then uses the temperature to set temperature-based parameters in the memory device such as by using the comparison circuit.

Vbg, is obtained by adding the base-emitter voltage (Vbe) across the transistor 131b and the voltage drop across the resistor R2. The bipolar transistor 133a has a larger area (by a factor N) than the transistor 133b. The PMOS transistors 131a and 131b are equal in size and are arranged in a current mirror configuration so that the currents I1 and I2 are substantially equal. We have Vbg=Vbe+R2×I2 and I1=Ve/R1 so that I2=Ve/R1. As a result, Vbg=Vbe+R2×kT ln(N)/R1×q, where T is temperature, k is Boltzmann's constant and q is a unit of electric charge. The source of the transistor 134 is connected to a supply voltage Vdd and the node between the transistor's drain and the resistor R3 is the output voltage, Voutput. The gate of the transistor 134 is connected to the same terminal as the gates of transistors 131a and 131b and the current through the transistor 134 mirrors the current through the transistors 131a and 131b.

Figure 2:
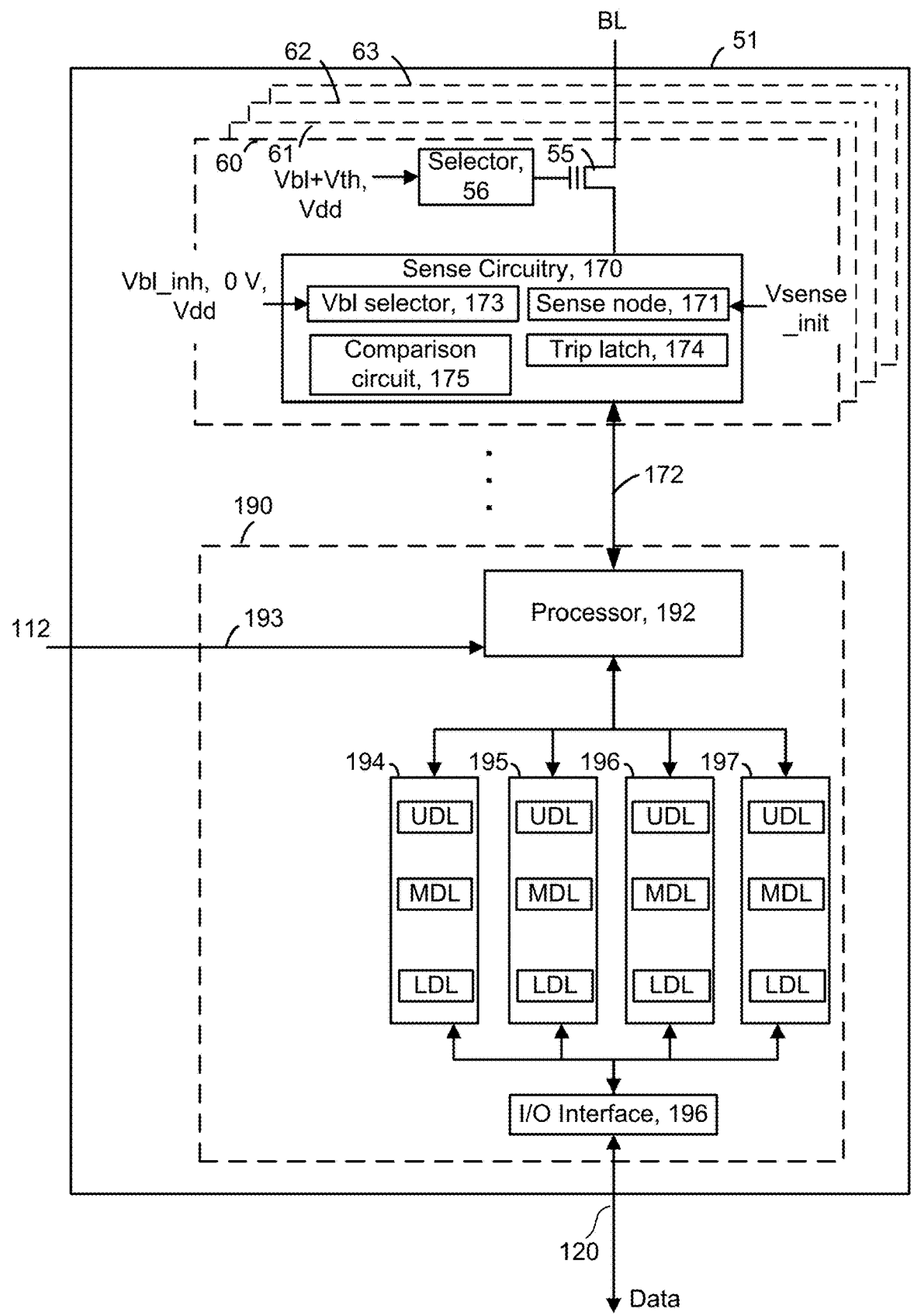
FIG. 2 is a block diagram depicting one embodiment of the sense block 51 of FIG. 1A.

FIG. 2 is a block diagram depicting one embodiment of the sense block 51 of FIG. 1. An individual sense block 51 is partitioned into one or more core portions, referred to as sense circuits 60-63 or sense amplifiers, and a common portion, referred to as a managing circuit 190. In one embodiment, there will be a separate sense circuit for each bit line/NAND string and one common managing circuit 190 for a set of multiple, e.g., four or eight, sense circuits. Each of the sense circuits in a group communicates with the associated managing circuit via data bus 172. Thus, there are one or more managing circuits which communicate with the sense circuits of a set of storage elements (memory cells).

The sense circuit 60, as an example, comprises sense circuitry 170 that performs sensing by determining whether a conduction current in a connected bit line is above or below a predetermined threshold level. The sensing can occur in a read or verify operation. The sense circuit also supplies a bit line voltage during the application of a program voltage in a program operation.

The sense circuitry may include a Vbl selector 173, a sense node 171, a comparison circuit 175 and a trip latch 174. During the application of a program voltage, the Vbl selector 173 can pass Vbl_inh (e.g., 2 V) to a bit line connected to a memory cell which is inhibited from programmed, or 0 V to a bit line connected to a memory cell which is being programmed in the current program loop. A transistor 55 (e.g., an nMOS) can be configured as a pass gate to pass Vbl from the Vbl selector 173, by setting the control gate voltage of the transistor sufficiently high, e.g., higher than the Vbl passed from the Vbl selector. For example, a selector 56 may pass a power supply voltage Vdd, e.g., 3-4 V to the control gate of the transistor 55.

During sensing operations such as read and verify operations, the bit line voltage is set by the transistor 55 based on the voltage passed by the selector 56. The bit line voltage is roughly equal to the control gate voltage of the transistor minus its Vth (e.g., 1 V). For example, if Vbl+Vth is passed by the selector 56, the bit line voltage will be Vbl. This assumes the source line is at 0 V. The transistor 55 clamps the bit line voltage according to the control gate voltage and acts a source-follower rather than a pass gate. The Vbl selector 173 may pass a relatively high voltage such as Vdd which is higher than the control gate voltage on the transistor 55 to provide the source-follower mode. During sensing, the transistor 55 thus charges up the bit line.

In one approach, the selector 56 of each sense circuit can be controlled separately from the selectors of other sense circuits, to pass Vbl or Vdd. The Vbl selector 173 of each sense circuit can also be controlled separately from the Vbl selectors of other sense circuits During sensing, the sense node 171 is charged up to an initial voltage such as 3 V. The sense node is then connected to the bit line via the transistor 55, and an amount of decay of the sense node is used to determine whether a memory cell is in a conductive or non-conductive state. The comparison circuit 175 is used to compare the sense node voltage to a trip voltage at a sense time. If the sense node voltage decays below the trip voltage Vtrip, the memory cell is in a conductive state and its Vth is at or below the voltage of the verification signal. If the sense node voltage does not decay below Vtrip, the memory cell is in a non-conductive state and its Vth is above the voltage of the verification signal. The sense circuit 60 includes a trip latch 174 that is set by the comparison circuit 175 based on whether the memory cell is in a conductive or non-conductive state. The data in the trip latch can be a bit which is read out by the processor 192.

The managing circuit 190 comprises a processor 192, four example sets of data latches 194-197 and an I/O Interface 196 coupled between the set of data latches 194 and data bus 120. One set of three data latches, e.g., comprising individual latches LDL, MDL and UDL, can be provided for each sense circuit. In some cases, a different number of data latches may be used. In a three bit per cell embodiment, LDL stores a bit for a lower page of data, MDL stores a bit for a middle page of data and UDL stores a bit for an upper page of data.

The processor 192 performs computations, such as to determine the data stored in the sensed memory cell and store the determined data in the set of data latches. Each set of data latches 194-197 is used to store data bits determined by processor 192 during a read operation, and to store data bits imported from the data bus 120 during a program operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed memory cell. As it steps through the various predefined control gate voltages corresponding to the various memory states supported by the memory, the sense circuit may trip at one of these voltages and a corresponding output will be provided from sense circuit to processor 192 via the data bus 172. At that point, processor 192 determines the resultant memory state by consideration of the tripping event(s) of the sense circuit and the information about the applied control gate voltage from the state machine via input lines 193. It then computes a binary encoding for the memory state and stores the resultant data bits into data latches 194-197.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 194-197 from the data bus 120.

The program operation, under the control of the state machine, applies a series of programming voltage pulses to the control gates of the addressed memory cells. Each voltage pulse may be stepped up in magnitude from a previous program pulse by a step size in a processed referred to as incremental step pulse programming. Each program voltage is followed by a verify operation to determine if the memory cells has been programmed to the desired memory state. In some cases, processor 192 monitors the read back memory state relative to the desired memory state. When the two are in agreement, the processor 192 sets the bit line in a program inhibit mode such as by updating its latches. This inhibits the memory cell coupled to the bit line from further programming even if additional program pulses are applied to its control gate.

Each set of data latches 194-197 may be implemented as a stack of data latches for each sense circuit. In one embodiment, there are three data latches per sense circuit 60. In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated memory cell has reached certain mileposts in a program operations. For example, latches may identify that a memory cell's Vth is below a particular verify voltage. The data latches indicate whether a memory cell currently stores one or more bits from a page of data. For example, the LDL latches can be used to store a lower page of data. An LDL latch is flipped (e.g., from 0 to 1) when a lower page bit is stored in an associated memory cell. For three bits per cell, an MDL or UDL latch is flipped when a middle or upper page bit, respectively, is stored in an associated memory cell. This occurs when an associated memory cell completes programming.

Figure 3:
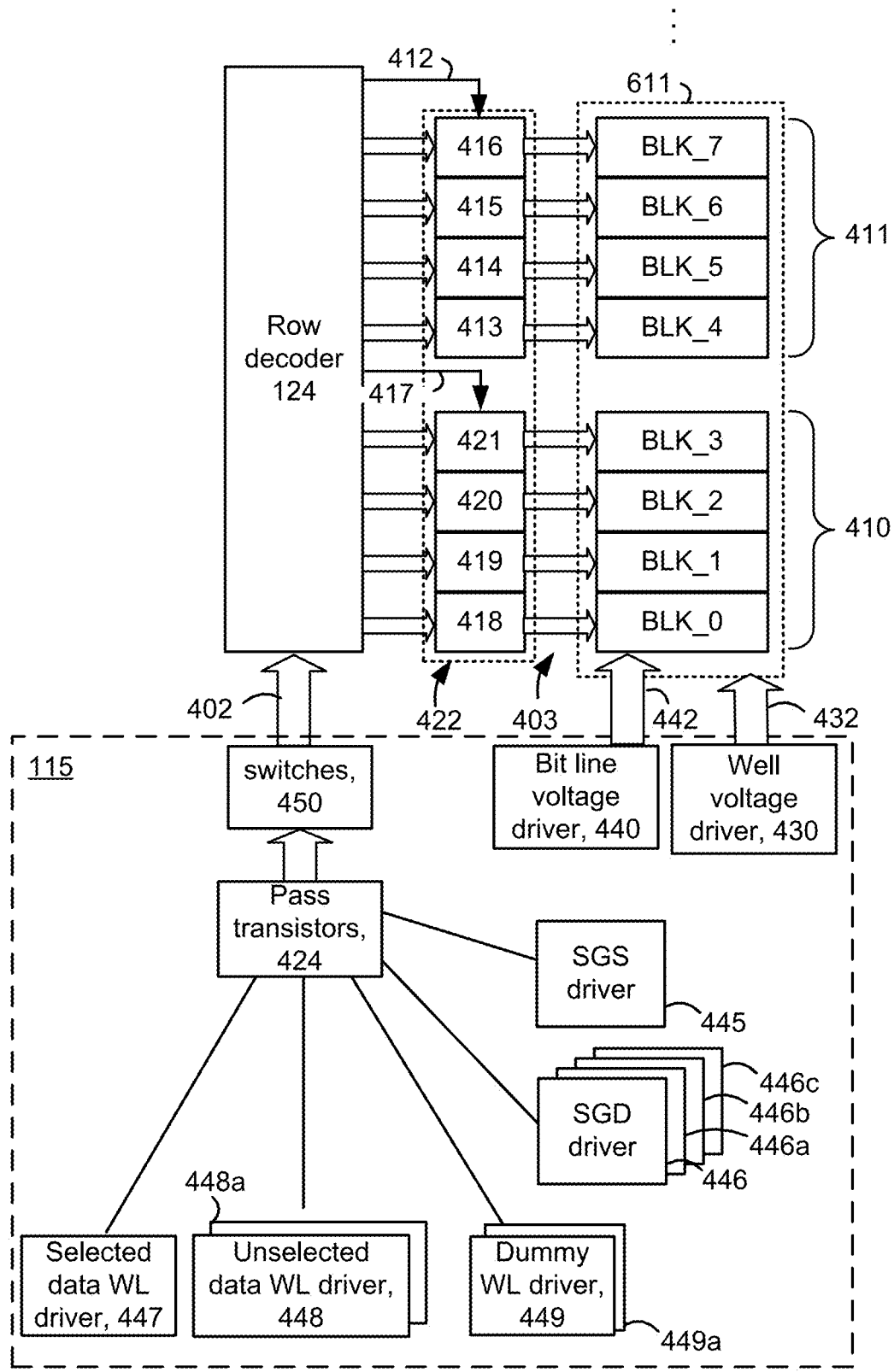
FIG. 3 depicts an example implementation of the power control module 115 of FIG. 1A for providing voltages to blocks of memory cells.

FIG. 3 depicts an example implementation of the power control module 115 of FIG. 1A for providing voltages to blocks of memory cells. In this example, the memory structure 126 includes a set 410 of four related blocks, BLK_0 to BLK_3, and another set 411 of four related blocks, BLK_4 to BLK_7. The blocks can be in one or more planes. The row decoder 124 of FIG. 1A provides voltages to word lines and select gates of each block via pass transistors 422. The row decoder provides a control signal to pass transistors which connect the blocks to the row decoder. In one approach, the pass transistors of each set of blocks are controlled by a common control gate voltage. Thus, the pass transistors for a set of block are either all on or off at a given time. If the pass transistors are on, a voltage from the row decoder is provided to the respective control gate lines or word lines. If the pass transistors are off, the row decoder is disconnected from the respective control gate lines or word lines so that the voltage floats on the respective control gate lines or word lines.

For instance, a control gate line 412 is connected to sets of pass transistors 413, 414, 415 and 416, which in turn are connected to control gate lines of BLK_4, BLK_5, BLK_6 and BLK_7, respectively. A control gate line 417 is connected to sets of pass transistors 418, 419, 420 and 421, which in turn are connected to control gate lines of BLK_0, BLK_1, BLK_2 and BLK_3, respectively.

Typically, program or read operations are performed on one selected block at a time and on one selected sub-block of the block. An erase operation may be performed on a selected block or sub-block. The row decoder can connect global control lines 402 to local control lines 403. The control lines represent conductive paths. Voltages are provided on the global control lines from a number of voltage drivers. Some of the voltage drivers may provide voltages to switches 450 which connect to the global control lines. Pass transistors 424 are controlled to pass voltages from the voltage drivers to the switches 450.

Figure 6A:
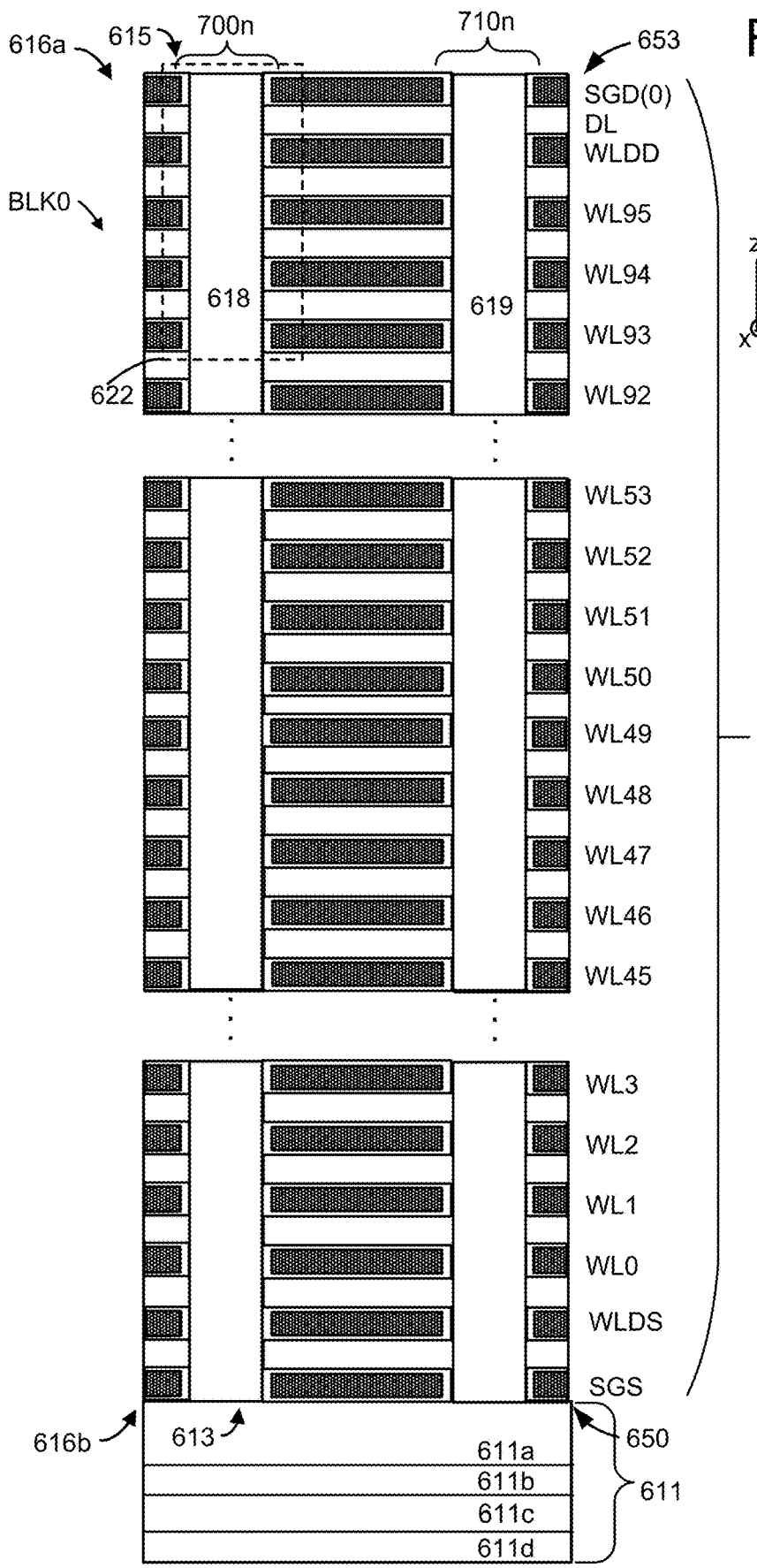
FIG. 6A depicts an example cross-sectional view of a portion of BLK0 of FIG. 4, including NAND strings 700n and 710n.

The voltage drivers can include a selected data word line (WL) driver 447, which provides a voltage on a data word line selected during a program or read operation, drivers 448 and 448a for unselected data word lines, and dummy word line drivers 449 and 449a which provide voltages on dummy word lines WLDD and WLDS, respectively, in FIG. 6A. For example, the driver 448 can be used to apply voltages to the drain-side unselected word lines in FIG. 13B and the driver 448a can be used to apply voltages to the source-side unselected word lines in FIG. 13C.

The voltage drivers can also include separate SGD drivers for each sub-block. For example, SGD drivers 446, 446a, 446b and 446c can be provided for SB0, SB1, SB2 and SB3, respectively, such as in FIG. 7. In one option, an SGS driver 445 is common to the different sub-blocks in a block.

The various components, including the row decoder, may receive commands from a controller such as the state machine 112 or the controller 122 to perform the functions described herein.

The well voltage driver 430 provides a voltage Vsl to the well region 611b (FIG. 6A) in the substrate, via control lines 432. The well voltage driver 430 is one example of a source line driver, where the well region 611b is a source line, e.g., a conductive path connected to the source ends of the NAND strings. In one approach, the well region 611a is common to the blocks. A set of bit lines 442 is also shared by the blocks. A bit line voltage driver 440 provides voltages to the bit lines. In a stacked memory device such as depicted in FIGS. 4 to 8B, sets of connected memory cells may be arranged in NAND strings which extend vertically upward from the substrate. The bottom (or source end) of each NAND string is in contact with the substrate, e.g., the well region, and the top end (or drain end) of each NAND string is connected to a respective bit line, in one approach.

Figure 4:
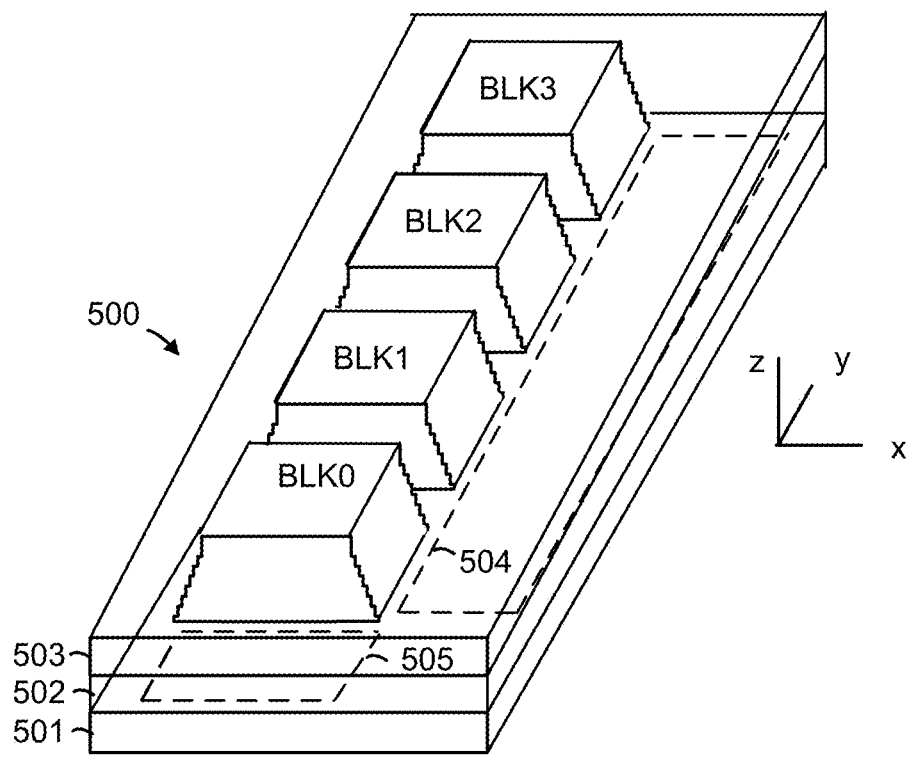
FIG. 4 is a perspective view of a memory device 500 comprising a set of blocks in an example 3D configuration of the memory structure 126 of FIG. 1A.

FIG. 4 is a perspective view of a memory device 500 comprising a set of blocks in an example 3D configuration of the memory structure 126 of FIG. 1. On the substrate are example blocks BLK0, BLK1, BLK2 and BLK3 of memory cells (storage elements) and peripheral areas with circuitry for use by the blocks. The peripheral area 504 runs along an edge of each block while the peripheral area 505 is at an end of the set of blocks. The circuitry can include voltage drivers which can be connected to control gate layers, bit lines and source lines of the blocks. In one approach, control gate layers at a common height in the blocks are commonly driven. The substrate 501 can also carry circuitry under the blocks, and one or more lower metal layers which are patterned in conductive paths to carry signals of the circuitry. The blocks are formed in an intermediate region 502 of the memory device. In an upper region 503 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. The blocks could also be arranged in multiple planes.

Figure 5:
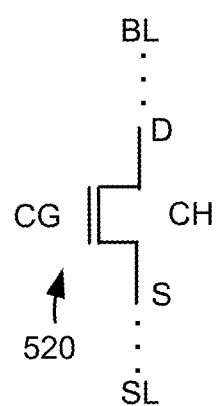
FIG. 5 depicts an example transistor 520.

FIG. 5 depicts an example transistor 520. The transistor comprises a control gate CG, a drain D, a source S and a channel CH and may represent a memory cell or a select gate transistor, for example. The drain end of the transistor is connected to a bit line BL optionally via one or more other transistors in a NAND string, and the source end of the transistor is connected to a source line SL optionally via one or more other transistors in a NAND string, FIG. 6A depicts an example cross-sectional view of a portion of BLK0 of FIG. 4, including NAND strings 700n and 710n. In this example, the NAND strings 700n and 710n are in different sub-blocks. The block comprises a stack 610 of alternating conductive layers (word line layers) and dielectric layers. The layers may be rectangular plates having a height in the z direction, a width in the y direction, and a length in the x direction.

The stack is depicted as comprising one tier but can optionally include one or more tiers of alternating conductive and dielectric layers. A stack comprises a set of alternating conductive and dielectric layers in which a memory hole is formed in a fabrication process.

The conductive layers comprise SGS, WLDS, WL0-WL95, WLDD and SGD(0). WLDS and WLDD are dummy word lines or conductive layers connected to dummy memory cells, which are ineligible to store user data. A dummy memory cell may have the same construction as a data memory cell but is considered by the controller to be ineligible to store any type of data including user data. One or more dummy memory cells may be provided at the drain and/or source ends of a NAND string of memory cells to provide a gradual transition in the channel voltage gradient. WL0-WL95 are data word lines connected to data memory cells, which are eligible to store user data. As an example only, the stack includes ninety-six data word lines. DL is an example dielectric layer.

A top 653 and bottom 650 of the stack are depicted. WL95 is the topmost data word line or conductive layer and WL0 is the bottommost data word line or conductive layer.

The NAND strings each comprise a memory hole 618 or 619, respectively, which is filled with materials which form memory cells adjacent to the word lines. For example, see region 622 of the stack which is shown in greater detail in FIG. 6B.

The stack is formed on a substrate 611. In one approach, a well region 611a (see also FIG. 3) is an n-type source diffusion layer or well in the substrate. The well region is in contact with a source end of each string of memory cells in a block. The n-type well region 611a in turn is formed in a p-type well region 611b, which in turn is formed in an n-type well region 611c, which in turn is formed in a p-type semiconductor substrate 611d, in one possible implementation. The n-type source diffusion layer may be shared by all of the blocks in a plane, in one approach, and form a source line SL which provides a voltage to a source end of each NAND string in a block.

The NAND string 700n has a source end 613 at a bottom 616b of the stack 610 and a drain end 615 at a top 616a of the stack. Metal-filled slits may be provided periodically across the stack as local interconnects which extend through the stack, such as to connect the source line to a line above the stack. See FIGS. 8A and 8B. The slits may be used during the formation of the word lines and subsequently filled with metal. Vias may be connected at one end to the drain ends of the NAND strings and at another end to a bit line.

In one approach, the block of memory cells comprises a stack of alternating control gate and dielectric layers, and the memory cells are arranged in vertically extending memory holes in the stack.

In one approach, each block comprises a terraced edge in which vertical interconnects connect to each layer, including the SGS, WL and SGD layers, and extend upward to horizontal paths to voltage drivers.

FIG. 6B depicts a close-up view of the region 622 of the stack of FIG. 6A. Memory cells are formed at the different levels of the stack at the intersection of a word line layer and a memory hole. An SGD transistor 716 connected to SGD (0), a dummy memory cell 715 connected to WLDD and data memory cells 712-714 connected to WL93-WL95, respectively, are depicted.

A number of layers can be deposited along the sidewall (SW) of the memory hole 629 and/or within each word line layer, e.g., using atomic layer deposition. For example, each pillar 685 or column which is formed by the materials within a memory hole can include a blocking oxide layer 663, a charge-trapping layer 664 or film such as silicon nitride (Si3N4) or other nitride, a tunneling layer 665 (e.g., a gate oxide), a channel 660 (e.g., comprising polysilicon), and a dielectric core 666 (e.g., comprising silicon dioxide). A word line layer can include a metal barrier 661 and a conductive metal 662 such as Tungsten as a control gate. For example, control gates 690-694 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

Each NAND string or set of connected transistors comprises a channel which extends continuously from one or more source-end select gate transistors to one or more drain-end select gate transistors. For example, the channels 700a, 710a, 720a and 730a extend continuously in the NAND strings 700n, 710n, 720n and 730n, respectively, from the source end to the drain end of each NAND string.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. See FIG. 6C-6F. During an erase operation, the electrons return to the channel.

While the above example is directed to a 3D memory device with vertically extending NAND strings, the techniques provided herein are also applicable to a 2D memory device in which the NAND strings extend horizontally on a substrate. Both 2D and 3D NAND strings may have a polysilicon channel with grain boundary traps. Moreover, the techniques may be applied to memory devices with other channel materials as well.

Note that the techniques described herein for using a state machine to implement different modes are compatible with various types of memory device including the 3D memory device of FIG. 4-8B and a 2D memory device.

FIG. 7 depicts an example view of NAND strings in the block BLK0 which is consistent with FIGS. 4 and 6A. The NAND strings are arranged in sub-blocks of the block in a 3D configuration. Each sub-block includes multiple NAND strings, where one example NAND string is depicted. For example, SB0, SB1, SB2 and SB3 comprise example NAND strings 700n, 710n, 720n and 730n, respectively. The NAND strings have data word lines, dummy word lines and select gate lines consistent with FIG. 6A. Each sub-block comprises a set of NAND strings which extend in the x direction and which have a common SGD line or control gate layer. The NAND strings 700n, 710n, 720n and 730n are in sub-blocks SB0, SB1, SB2 and SB3, respectively. Programming of the block may occur based on a word line programming order. One option is to program the memory cells in different portions of a word line which are in the different sub-blocks, one sub-block at a time, before programming the memory cells of the next word line. For example, this can involve programming WL0 in SB0, SB1, SB2 and then SB2, then programming WL1 in SB0, SB1, SB2 and then SB2, and so forth. The word line programming order may start at WL0, the source-end word line and end at WL95, the drain-end word line, for example.

The NAND strings 700n, 710n, 720n and 730n have channels 700a, 710a, 720a and 730a, respectively. Additionally, NAND string 700n includes SGS transistor 701, dummy memory cell 702, data memory cells 703-714, dummy memory cell 715 and SGD transistor 716. NAND string 710n includes SGS transistor 721, dummy memory cell 722, data memory cells 723-734, dummy memory cell 735 and SGD transistor 736. NAND string 720n includes SGS transistor 741, dummy memory cell 742, data memory cells 743-754, dummy memory cell 755 and SGD transistor 756. NAND string 730n includes SGS transistor 761, dummy memory cell 762, data memory cells 763-774, dummy memory cell 775 and SGD transistor 776.

This example depicts one SGD transistor at the drain-end of each NAND string, and one SGS transistor at the source-end of each NAND string. The SGD transistors in SB0, SB1, SB2 and SB3 may be driven by separate control lines SGD(0), SGD(1), SGD(2) and SGD(3), respectively, in one approach. In another approach, multiple SGD and/or SGS transistors can be provided in a NAND string.

Figure 8A:
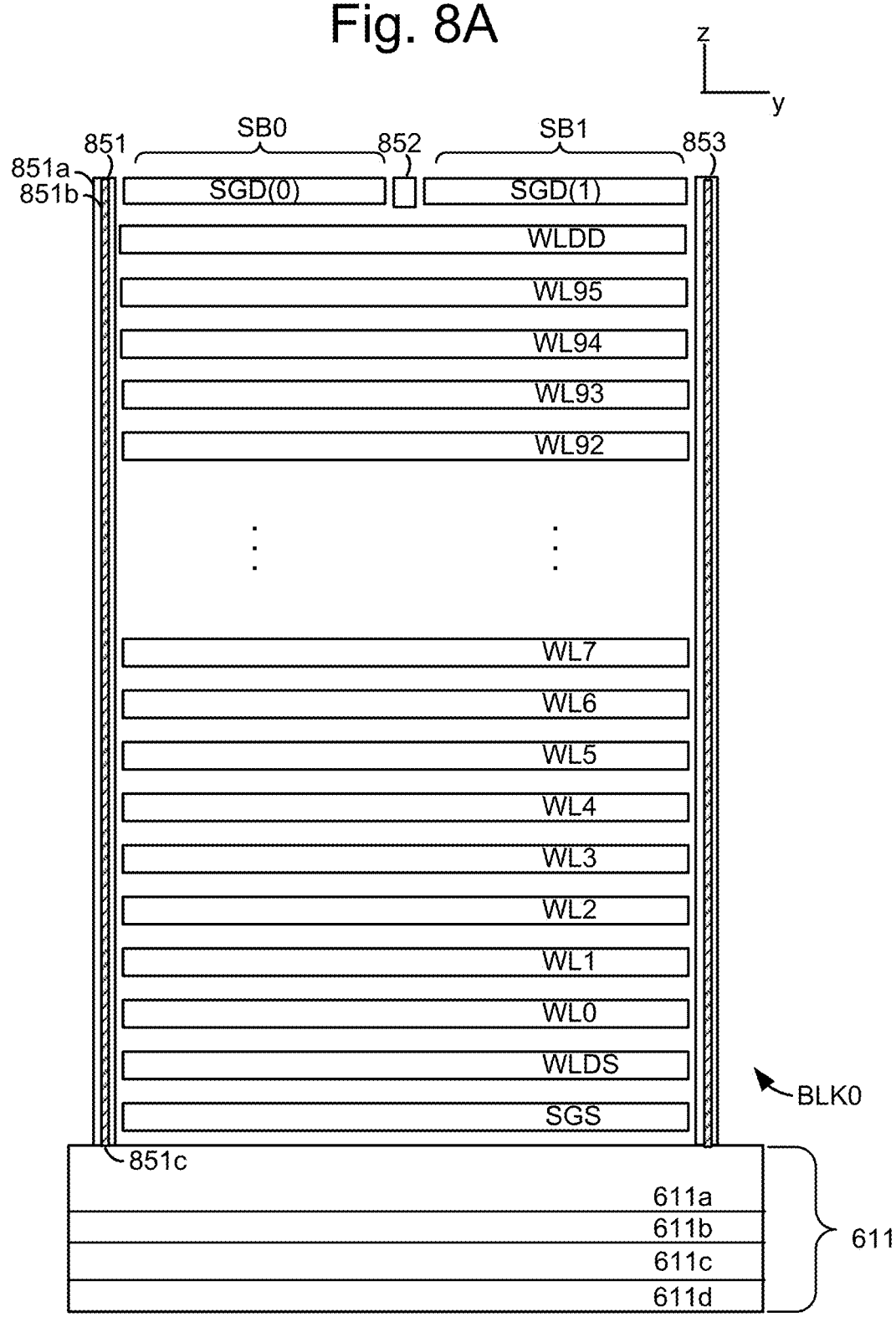
FIG. 8A depicts an example cross-sectional view of a portion of the block BLK0 of memory cells consistent with FIG. 6A.

FIG. 8A depicts an example cross-sectional view of a portion of the block BLK0 of memory cells consistent with FIG. 6A. The block comprises a plurality of control gate layers spaced apart vertically and separated by dielectric layers (not depicted). The control gate layers include data word line layers WL0-WL95, dummy word line layers WLDS and WLDD, and select gate layers SGS and SGD. Each layer may have the shape of a rectangular plate. Additionally, a separate SGD layer SGD(0)-SGD(3) is provided in each sub-block SB0-SB3, respectively.

The block includes local interconnects (LI) 851 and 853. The local interconnects can be provided periodically in a block, typically at the edges of a block and in an interior region. Additionally, an isolation region 852 separates the SGD(0) and SGD(1) layers in sub-blocks SB0 and SB1, respectively.

The local interconnect 851 can comprise a conductive material 851b such as metal surrounded by insulating material 851a to prevent conduction with the metal of the adjacent word lines. The local interconnect is connected at its bottom 851c to the well region 611a (FIG. 6A) of the substrate. The substrate is one example of a source line, e.g., a conductive path connected to the source ends of the NAND strings. In other memory device architectures, the source line can be separate from the substrate. For example, in the CMOS under array or circuit under array architecture, the source line no longer comprises the substrate.

Each dummy word line layer and data word line layer extends across all sub-blocks of a block. The local interconnect 853 only partially interrupts a word line layer. Each SGS layer may also extend across all sub-blocks of a block, in one approach.

FIG. 8B depicts an example top view of the portion of block BLK0 of FIG. 8A. The SGD layers of SGD(0)-SGD(3) are depicted, along with the local interconnects 851 and 853, and the isolation region 852. Each SGD layer has a number of memory holes or NAND strings passing through it. Each circle represents the cross-section of a memory hole or string. A number of bit lines BL0 to BL31 extend above the memory holes, across the top of the stack. Each bit line is connected to one NAND string in each sub-block as indicated by the "X" symbols. For example, BL31 is connected to NAND strings 860 and 861 in SB1 and SB2, respectively. The NAND strings are arranged in rows which extend in the x-direction, and adjacent rows are staggered to improve the memory hole density. For example, the NAND strings in SB0 are arranged in four rows, R1-R4. R1-R4 includes example NAND strings 857-860, respectively. Eight NAND strings per row are depicted as a simplified example. In practice, the sub-blocks are elongated in the x direction and contain thousands of NAND strings.

FIG. 8C depicts the example NAND strings 859 and 860 of rows R3 and R4, respectively, in FIG. 8B, showing the movement of electrons which results in program disturb of a memory cell 893 of WL4. Assume the NAND string 860 is a programmed or selected NAND string (NAND_pgm) and the NAND string 859 is an inhibited or unselected NAND string (NAND_inh). Also, assume WL4 is the selected word line being programmed, a memory cell 880 is a selected memory cell and a memory cell 893 is an unselected memory cell. The dashed line boxes depict memory cells or select gate transistors. The NAND string 860 includes an SGS transistor 886, a dummy memory cell 885 and data memory cells 884-880 connected to WL0-WL4, respectively. The NAND string 859 includes an SGS transistor 887, a dummy memory cell 888 and data memory cells 889-893 connected to WL0-WL4, respectively.

During the program recovery phase of a program loop (see t4-t10 in FIG. 13A-13H), electrons (represented by "-") can conduct in the channel of the programmed NAND string toward the well region 611a. The electrons can enter the channel of the inhibited NAND string 859, move upward toward WL4, and be injected into the memory cell 893, thereby causing SSI disturb of the memory cell 893. The electrons are attracted to the channel of the inhibited NAND string by its positive boosting voltage. The movement of electrons in the channel of the selected NAND string, from WL4 to the well region, is facilitated when the memory cells connected to WL0-WL3 in the programmed NAND string are in the erased state or other low data state. The injection of the electrons into the memory cell 893 is facilitated when the memory cell 893 is in the erased state or other low data state, and the source-side memory cell 892 of WL3 (WLn−1) is in a high state so that it is weakly turned on (in the conductive state). In this configuration, in the inhibited NAND string, a high channel gradient is created in the channel between WLn and WLn−1 along with a potential different across the memory cells of WLn which facilitates the SSI program disturb.

In particular, the SGS transistor can become temporarily conductive at different time in the recovery phase. One example is during an equalization of the SGD and SGS transistors if a Vprogram pass to Vrecovery transition is disabled. The Vprogram pass to Vrecovery transition refers to a decrease in the voltages of the unselected word line from a program pass voltage to a lower recovery voltage in the recovery phase. If this transition is disabled, the voltages of the unselected word lines do not decrease from a program pass voltage to a lower recovery voltage in the recovery phase. In another example, the SGS transistor can become temporarily conductive when the source line voltage, Vsl, ramps down from 1 V to 0 V, for example, in the recovery phase. See t9 in FIG. 13H. The SGS transistors can be weakly turned on (conductive) at this time.

The SSI program disturb occurs in the inhibited NAND strings in a selected sub-block.

To reduce the leakage, portions 886a and 887a of the well region 611a can be doped to increase the Vth of the SGS transistors 886 and 887, respectively. For instance, a p-type dopant such as Boron can be used to increase the Vth of the SGS transistors above the intrinsic level. The Vth may also be increase by programming the SGS transistors. The channel in the NAND strings may be epitaxial silicon so that Vth is very low and is mainly controlled by the doping in the well region.

FIG. 8D depicts a plot of a number of read errors versus Vsgs for different Vth levels of the SGS transistor 886. As mentioned, doping of the well region can be used to increase the Vth of the SGS transistors and help reduce leakage through these transistors. Plots 894-897 represent increasing levels of Vth due to various doping conditions. The plots merge into a plot 898. However, the magnitude of Vth is limited, and the Vsgs margin may be less than 1 V, for example. When Vsl is ramped down from 1 V to 0 V, for example, the back bias of the SGS transistors can decrease to the point that leakage occurs, allowing the movement of electrons between adjacent memory holes.

FIG. 9A-9F depict results from tests which demonstrate leakage between adjacent memory holes in different rows of a sub-block, consistent with rows R1-R4 in SB0 in FIG. 8B. As mentioned, electrons can conduct from one memory hole to another memory hole to cause SSI program disturb. The tests indicate that the conduction is strongest between adjacent memory holes, e.g., in adjacent rows or in one row. The tests also indicate that the disturb of the Er-state memory cells, as measured by the upper tail Vth, is reduced when the ramp down time is increased for VWLunsel to transition from Vprogram pass to Vrecovery. FIG. 9A-9C depict results using a relatively long ramp down time, and FIG. 9D-9F depict results using a relatively short ramp down time. The upper tail Vth is lower in FIG. 9A-9C compared to FIG. 9D-9F. The Er-state memory cells are in WL0 which is randomly programmed to states Er-G.

FIG. 9A depicts a plot of Vth distributions for Er-state memory cells in rows 1 and 3 of the sub-block SB0 of FIG. 8B due to program disturb caused by programming memory cells of row 2 to the F and G states, using a long ramp down time for VWLunsel to transition from Vprogram pass to Vrecovery. Plots 900 and 901 represent the Vth of R3 and R1, respectively, and plots 902 and 903 represent the Vth of the F- and G-state memory cells, respectively, of R2. The R4 cells are in the erased state. The Vth distributions of R1 and R3 are roughly similar since they are both adjacent to R2.

FIG. 9B depicts a plot of Vth distributions for Er-state memory cells in rows 1 and 4 of the sub-block SB0 of FIG. 8B due to program disturb caused by programming memory cells of row 2 to the F and G states, and by programming memory cells of row 3 to the G state, using a long ramp down time for VWLunsel to transition from Vprogram pass to Vrecovery. Plots 910 and 911 represent the Vth of R4 and R1, respectively, and plots 912 and 913 represent the Vth of the F-state memory cells of R2 and the G-state memory cells of R2 and R3, respectively. The Vth distributions of R1 and R3 are roughly similar since R1 is adjacent to R2 and R4 is adjacent to R3.

FIG. 9C depicts a plot of Vth distributions for Er-state memory cells in row 1 of the sub-block SB0 of FIG. 8B due to program disturb caused by programming memory cells of row 2 to the F and G states, and by programming memory cells of rows 3 and 4 to the G state, using a long ramp down time for VWLunsel to transition from Vprogram pass to Vrecovery. Plot 920 represents the Vth of R1 and plots 921 and 922 represent the Vth of the F-state memory cells of R2 and the G-state memory cells of R2-R4, respectively. The Vth distribution of R1 is similar to Vth distribution of plots 901 and 911. This shows that the presence of the G-state memory cells in R3 and R4, which are two and three rows, respectively, away from R1, does not cause an additional disturb of R1.

FIG. 9D depicts a plot of Vth distributions comparable to those in FIG. 9A except a short ramp down time is used for VWLunsel to transition from Vprogram pass to Vrecovery. Plots 930 and 931 represent the Vth of R3 and R1, respectively, and plots 932 and 933 represent the Vth of the F- and G-state memory cells, respectively, of R2. The R4 cells are in the erased state. The Vth of R1 and R3 is upshifted by a greater amount than in FIG. 9A, demonstrating the effect of the shorter ramp down time.

FIG. 9E depicts a plot of Vth distributions comparable to those in FIG. 9B except a short ramp down time is used for VWLunsel to transition from Vprogram pass to Vrecovery. Plots 940 and 941 represent the Vth of R4 and R1, respectively, and plots 942 and 943 represent the Vth of the F-state memory cells of R2 and the G-state memory cells of R2 and R3, respectively. The Vth distribution of R1 and R4 is upshifted by a greater amount than in FIG. 9B, demonstrating the effect of the shorter ramp down time.

FIG. 9F depicts a plot of Vth distributions comparable to those in FIG. 9C except a short ramp down time is used for VWLunsel to transition from Vprogram pass to Vrecovery. Plot 950 represents the Vth of R1 and plots 951 and 952 represent the Vth of the F-state memory cells of R2 and the G-state memory cells of R2-R4, respectively. The Vth distribution of R1 is upshifted by a greater amount than in FIG. 9C, demonstrating the effect of the shorter ramp down time.

Figure 10A:
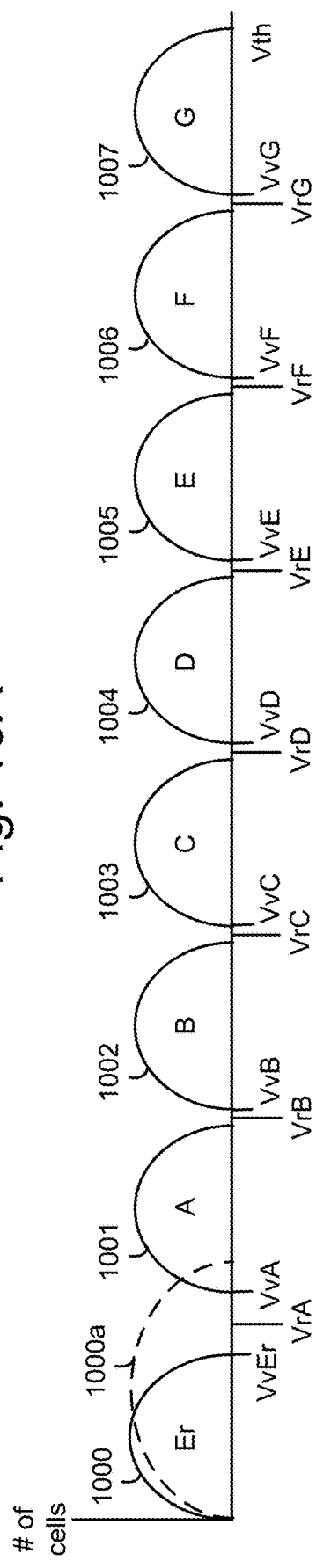
FIG. 10A depicts example Vth distributions of a set of memory cells with three bits per cell and eight data states.

FIG. 10A depicts example Vth distributions of a set of memory cells with three bits per cell and eight data states. The vertical axis depicts a number of memory cells on a logarithmic scale, and the horizontal axis depicts a Vth of the memory cells on a linear scale. In one approach, at a start of a program operation, the memory cells are all initially in the erased (Er) state, as represented by the Vth distribution 1000. After the program operation is successfully completed, the memory cells assigned to the A-G states are represented by the Vth distributions 1001-1007. The memory cells assigned to the erased state may experience SSI program disturb so that they are represented by the Vth distribution 1000a with an upshifted upper tail.

The memory cells which are programmed to the A-G states using verify voltages of VvA-VvG, respectively, are represented by the Vth distributions 1001-1007, respectively. These Vth distributions are obtained just after completion of the program operation, and assume no program disturb or neighbor word line interference has occurred. The verify voltages are used in the program-verify tests of the memory cells. Read voltages VrA-VrG can be used for reading the states of the memory cells in a read operation. The verify voltages and read voltages are examples of program parameters for three-bit per cell operations.

In an erase operation, the data memory cells transition from the Vth distributions of the programmed data states, e.g., states A-G, to the erased state. The erase operation includes an erase phase in which the memory cells are biased for erasing followed by an erase-verify test. The erase-verify test can use an erase-verify voltage, VvEr, which is applied to the word lines.

The Er-G states are examples of assigned data states, and the A-G states are examples of programmed data states, in this eight state example. The number of data states could be higher or low than eight data states.

Figure 10B:
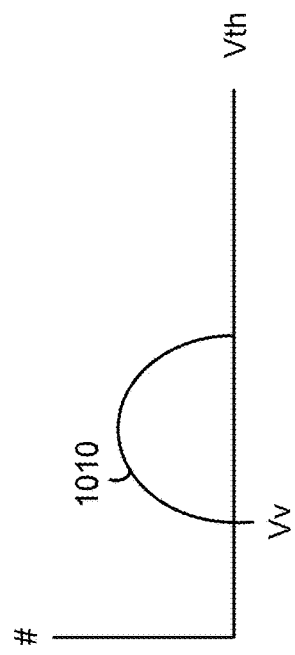
FIG. 10B depicts example Vth distribution of SGS select gate transistors.

FIG. 10B depicts example Vth distribution 1010 of SGS select gate transistors. The Vth distribution is typically fixed at a predictable level. Doping and/or programming may be used to obtain the desired Vth, e.g., 1-2 V. Vv represents a lower boundary of the Vth distribution and may be a verify voltage if programming is used.

FIG. 11A depicts an example voltage signal used in a program operation, consistent with FIG. 10A. The voltage signal 1100 includes a set of program voltages, including an initial program voltage 1101, which are applied to a word line selected for programming. The initial program voltage is represented by Vpgm_init and dVpgm denotes the step size. A single program pass is used having 22 program loops, as an example. The verification signals in each program loop, including example verification signals 1102, can encompass lower assigned data states, then midrange assigned data states and then higher assigned data states as the program operations proceeds, as depicted in FIG. 11B.

The example verification signals depict three verify voltages as a simplification. As used herein, a verification signal comprises a signal which is applied to a selected word line during a program loop after the application of a program voltage to the selected word line. The verification signal is part of a sensing operation. Memory cells are sensed during the application of the verification signal to judge their programming progress. A verification signal includes one or more voltages which are used to judge whether the memory cell has completed programming to an assigned data state. The result of sensing of the Vth relative to a verify voltage can be used to inhibit further programming of a memory cell.

The data which is programmed or read can be arranged in pages. For example, with two bits per cell, two pages of data can be stored in the memory cells connected to a word line. An example encoding of bits for the Er-C states is 11, 10, 00 and 01, respectively, in the format of upper page (UP)/lower page (LP). The data of the lower and upper pages can be determined by reading the memory cells using read voltages of VrA and VrC; and VrB, respectively.

With three bits per cell, three pages of data can be stored in the memory cells connected to a word line. An example encoding of bits for the Er-G states is 111, 110, 100, 000, 010, 011, 001 and 101, respectively, in the format of UP/middle page (MP)/LP. The data of the lower, middle and upper pages can be determined by reading the memory cells using read voltages of VrA and VrE; VrB; and VrC and VrG, respectively.

FIG. 11B depicts an example of verify voltages used in different program loops of FIG. 11A. The horizontal bars are time-aligned with the program loop axis of FIG. 11A. The bars overlap in some program loops, indicating that verify operations can be performed for multiple data states in the program loop. With eight data states, the bars indicate that verify voltages for the A, B, C, D, E, F and G states are applied in verification signals in program loops 1-5, 4-8, 7-11, 10-14, 13-17, 16-20 and 18-22, respectively. As mentioned, the verification signals in each program loop can encompass lower assigned data states, then midrange assigned data states and then higher assigned data states as the program operation proceeds.

Figure 12C:
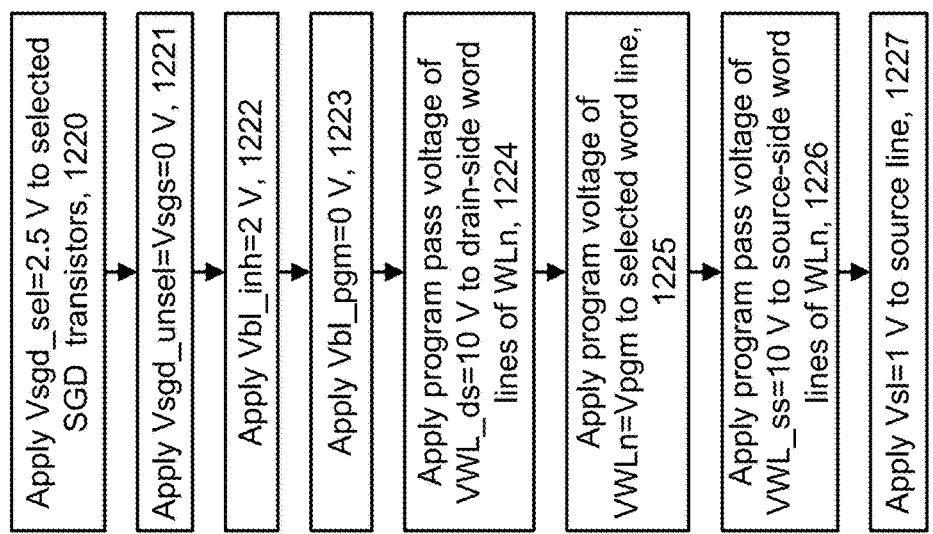
FIG. 12C depicts a flowchart of an example process for performing the program phase of step 1202 of FIG. 12A.
Figure 12B:
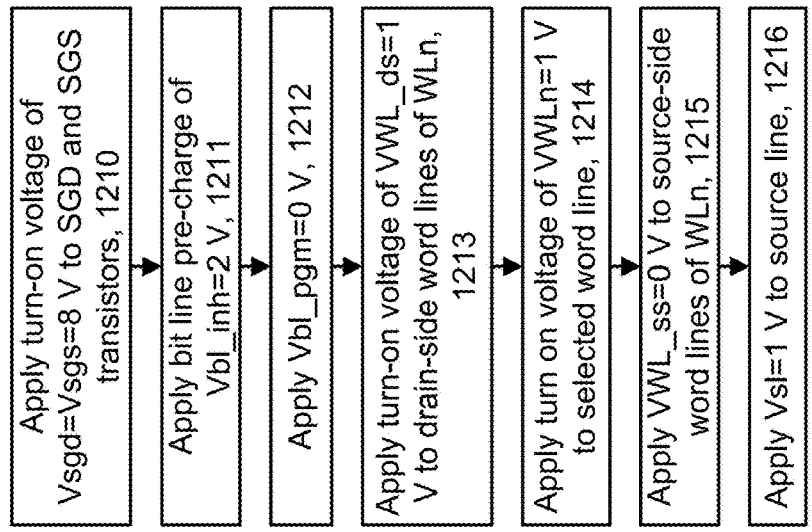
FIG. 12B depicts a flowchart of an example process for performing the pre-charge phase of step 1201 of FIG. 12A.
Figure 12A:
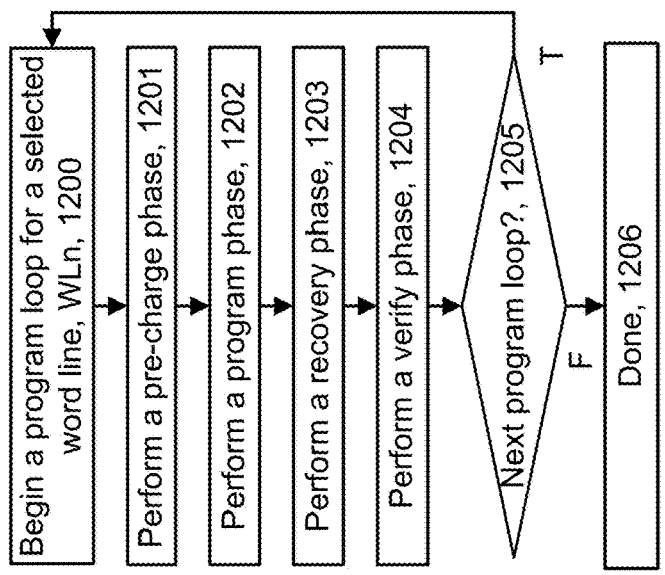
FIG. 12A depicts a flowchart of an example program loop in a program operation.

FIG. 12A depicts a flowchart of an example program loop in a program operation. A program operation can include a series of program loops such as discussed in connection with FIG. 11A. Step 1200 begins a program loop for a selected word line, WLn. Step 1201 performs a pre-charge phase of the program loop. Step 1202 performs a program phase of the program loop. Step 1203 performs a recovery phase of the program loop. Step 1204 performs a verify phase of the program loop. See also FIG. 13A-13G which depict the pre-charge, program, recovery and verify phases 1390-1393, respectively.

A decision step 1205 determines if there is a next program loop. A next program loop is performed is the program operation is not yet completed. If the decision step 1205 is true, step 1200 is repeated by starting the next program loop. If the decision step 1205 is false, step 1206 indicates the program operation is done.

FIG. 12B depicts a flowchart of an example process for performing the pre-charge phase of step 1201 of FIG. 12A. Step 1210 includes applying a turn-on voltage of Vsgd=Vsgs=8 V to the SGD and SGS transistors, to provide them in a strongly conductive state. See plots 1350 and 1360 in FIGS. 13F and 13G, respectively, at t0-t1. Step 1211 includes applying a bit line pre-charge of Vbl_inh=2 V. See plot 1340 in FIG. 13E at t0-t1. Step 1212 includes applying Vbl_pgm=0 V to the bit lines of the programmed NAND strings. See plot 1330 in FIG. 13D at t0-t1. Step 1213 includes applying a turn-on voltage of VWL_ds=1 V to the drain-side word lines of WLn. See plot 1310 in FIG. 13B at t0-t1. This provides the associated channel regions in a conductive state to pass the bit line voltage into the channel. Step 1214 includes applying a turn-on voltage of VWLn=1 V to the selected word line. See plot 1330 in FIG. 13D at t0-t1. This also provides the associated channel region in a conductive state to pass the bit line voltage into the channel, when the WLn memory cells are in the erased state or a low state, at the beginning of a program operation.

Step 1215 includes applying VWL_ss=0 V to the source-side word lines of WLn. See plot 1320 in FIG. 13C at t0-t1. The associated channel regions are in a non-conductive state since the memory cells have been programmed to higher Vth levels. The bit line pre-charge mainly pre-charges the portion of the channel on the drain-side of WLn. Step 1216 includes applying Vsl=1 V to the source line. See plot 1370 in FIG. 13H at t0-t1. This provides a back bias for the SGS transistors to reduce leakage.

The steps may be performed concurrently. The voltages depicted in the various figure are examples.

FIG. 12C depicts a flowchart of an example process for performing the program phase of step 1202 of FIG. 12A. Step 1220 includes applying Vsgd_sel=2.5 V to the selected SGD transistors, e.g., the SGD transistors in a selected sub-block. See plot 1351 in FIG. 13F at t2-t4. Step 1221 includes applying Vsgd_unsel=Vsgs=0 V. See plot 1361 in FIG. 13G at t2-t4. Vsgd_unsel is for the SGD transistors in the unselected sub-blocks. This provides the unselected SGD transistors in a non-conductive state. Step 1222 include applying Vbl_inh=2 V to the inhibited bit lines. See plot 1340 in FIG. 13E at t2-t4. This provides the associated SGD transistors in a non-conductive state to allow channel boosting to occur. Step 1223 include applying Vbl_pgm=0 V to the programmed bit lines. See plot 1331 in FIG. 13D at t2-t4. This provides the associated SGD transistors in a conductive state to allow programming to occur. Step 1224 includes applying a program pass voltage of VWL_ds=10 V to the drain-side word lines of WLn. See plot 1311 in FIG. 13B at t2-t4. This boosts the associated channel regions in the inhibited NAND strings. Step 1225 includes applying a program voltage of VWLn=Vpgm (e.g., 20-30 V) to the selected word line. See plot 1303 in FIG. 13A at t2-t4. This provides a high gate-to-channel voltage which programs the WLn memory cells in the programmed NAND strings. Step 1226 includes applying a program pass voltage of VWL_ss=10 V to the source-side word lines of WLn. See plot 1321 in FIG. 13C at t2-t4. This boosts the associated channel regions in the inhibited NAND strings. Step 1227 includes applying Vsl to the source line. See plot 1370 in FIG. 13H at t2-t4. This continues to provide a back bias for the SGS transistors to reduce leakage.

The steps may be performed concurrently.

FIG. 12D depicts a flowchart of a first example process for performing the recovery phase of step 1203 of FIG. 12A. In FIG. 12D-12G, the boxes in the flowcharts are grouped to depict a time sequence which is consistent with FIG. 13A-13H. The boxes which are aligned vertically occur concurrently.

Step 1230 includes maintaining Vsgd_unsel=Vsgs=0 V (see plot 1361 in FIG. 13G at t4410) and step 1231 includes maintaining Vbl_pgm=0 V (see plot 1331 in FIG. 13D at t4-t10). At t4, step 1232 includes ramping down VWLn from Vpgm to Vcc=3 V (see plot 1304 in FIG. 13A at t4-t6), for example, where Vcc is a power supply voltage of the memory chip.

Subsequently, steps 1233-1235 may be performed at t6. Step 1233 includes ramping down VWL_ds from the program pass voltage of VWL_ds=10 V to a respective recovery voltage of Vrec_ds=4.5 V (see plots 1312 and 1314 in FIG. 13B at t6-t10). Step 1234 includes ramping up VWLn from Vcc to a respective recovery voltage of 4.5 V (see plot 1305 in FIG. 13A at t6-t10). Step 1235 includes ramping down VWL_ss from the program pass voltage of VWL_ss=10 V to a respective recovery voltage of Vrec_ss=4.5 V (see plot 1322 in FIG. 13C at t6-t10).

In steps 1233-1235, the relatively high word line voltages are ramped down to reduced levels to allow the channels to discharge to prepare for the subsequent verify phase. The reduced levels can be positive voltages. For the unselected word lines, their voltage will be increased again in the verify phase so that they can be ramped up more quickly. For the selected word line, its voltage may be increased or decreased depending on the data states which are verified in the verify phase. VWLsel could optionally be ramped down directly from Vpgm to Vrecovery instead of transitioning down from Vpgm to Vcc and up from Vcc to Vrecovery.

Subsequently, at t7, step 1236 includes ramping down Vsgd_sel from 2.5 V to 0 V (see plot 1352 in FIG. 13G at t7410). Subsequently, at t8, step 1237 includes ramping down Vbl_inh from 2 V to 0 V (see plots 1341 and 1343 in FIG. 13E at t8410). As mentioned, if the voltages of the selected and unselected word lines are not fully ramped down when Vsl begins to ramp down, the SGS transistor can temporarily conduct a leakage current which leads to SSI program disturb in an inhibited NAND string. Moreover, an insufficient ramp down of the voltages of the selected and unselected word lines may result in a high residual boosting potential in the inhibited NAND strings which draws in the electrons of the leakage current. The ramp down of Vsl can also lower the Vth of the SGS transistor. The above factors increase the risk of SSI program disturb.

Subsequently, at t9, step 1238 includes ramping down Vsl from 1 V to 0 V (at t9, plot 1371 in FIG. 13H).

FIG. 12E depicts a flowchart of a second example process for performing the recovery phase of step 1203 of FIG. 12A. Step 1230-1232 are repeated from FIG. 12D. At t5, step 1233a includes an early ramp down of VWL_ds from the program pass voltage of VWL_ds=10 V to the recovery voltage of Vrec=4.5 V (see plots 1313 and 1314 in FIG. 13H at t5410). One factor in SSI program disturb is that the drain-side channel region of WLn has a high residual boosting potential in the inhibited NAND strings due to a larger RC time constant for ramping down the drain-side word lines. This is due to a relatively large memory hole diameter and a corresponding smaller word line volume for the drain-side word lines compared to the source-side word lines, since the memory hole tapers from a larger diameter at the top of the stack to a smaller diameter at the bottom. A smaller word line volume corresponds to a larger resistance and RC time constant. By ramping down the drain-side word lines before the source-side word lines, the associated drain-side channel region has a longer time to discharge so that the residual boosting potential is reduced. VWL_ds should ramp down after VWLn ramps down.

The remaining steps 1234-1238 are repeated from FIG. 12D.

FIG. 12F depicts a flowchart of a third example process for performing the recovery phase of step 1203 of FIG. 12A. Step 1230-1235 are repeated from FIG. 12D. At t6, step 1237a includes an early ramp down of Vbl_inh from 2 V to 0 V (see plots 1342 and 1343 in FIG. 13E at t6-t10). This helps to discharge the boosting potential in the inhibited NAND strings. Vbl_inh is ramped down before Vsgd_sel ramps down at step 1236 (at t7 in FIG. 13F). The channel potential of the inhibited NAND strings is discharged to Vss=0 V. To avoid conventional program disturb, Vbl_inh should ramp down after VWLn ramps down.

The remaining steps 1236 and 1238 are repeated from FIG. 12D.

Figure 12H:
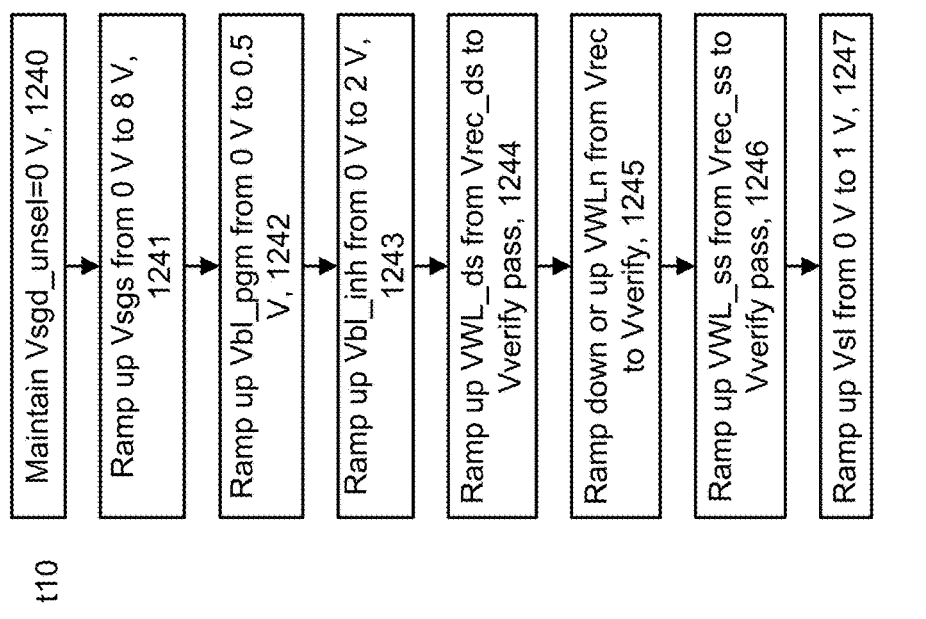
FIG. 12H depicts a flowchart of an example process for performing the verify phase of step 1204 of FIG. 12A.
Figure 12G:
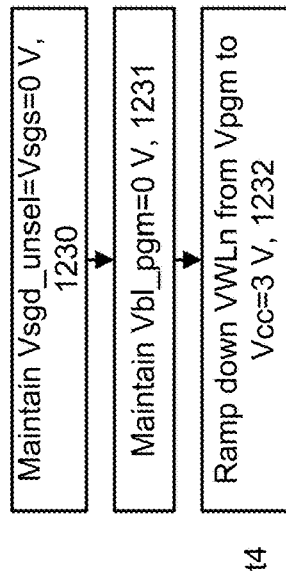
FIG. 12G depicts a flowchart of a fourth example process for performing the recovery phase of step 1203 of FIG. 12A.

FIG. 12G depicts a flowchart of a fourth example process for performing the recovery phase of step 1203 of FIG. 12A. The timing of the steps is the same as in FIG. 12D but the recovery voltage is lower for WL and WL_ss. At t6, step 1234a includes maintaining VWLn at Vcc which may be equal to a respective reduced recovery voltage of 3 V (which is lower than normal recovery voltage of 4.5 V in step 1234 of FIG. 12D), for instance (see plot 1309 in FIG. 13A at t6-t10). Another option is to ramp up VWLn from Vcc to a respective recovery voltage, such as 3.5-4 V, which is lower than the normal recovery voltage of 4.5 V.

Step 1235s includes ramping down VWL_ss from the program pass voltage of VWL_ss=10 V to a respective reduced recovery voltage of Vrec_ds=3 V (which is lower than recovery voltage of 4.5 V in step 1235 of FIG. 12D). See plot 1323 in FIG. 13C at t6-t10).

Vrecovery is an intermediate voltage which is applied in the recovery phase between the applying of Vpass program (also referred to as just Vpass) in the program phase and the applying of Vpass verify (also referred to as Vread) in the verify phase. If it is set too high, this can cause read disturb in the programmed NAND strings. If Vrecovery is set too low, this increases the time to ramp up the voltage to Vpass verify, thus increasing the overall time of the program loop.

If WLn and the source-side unselected word lines are ramped down to a lower recovery voltage, the electron conduction through the associated channel regions of the programmed NAND string can be reduced, thereby reducing the risk of a leakage current which causes SSI program disturb in an adjacent inhibited NAND string. A lower recovery voltage is tolerable on the source-side word lines since the source-side word lines have a lower resistance and RC time constant (due to the smaller memory hole diameter and the corresponding larger word line volume) and can therefore be ramped up more quickly, so a time penalty is avoided.

Moreover, since SSI program disturb occurs mainly for the lower half of the word lines, the reduced recovery voltage may be used when WLn is in the lower half of the word lines but not when WLn is in the upper half of the word lines. See FIG. 16A.

FIG. 12H depicts a flowchart of an example process for performing the verify phase of step 1204 of FIG. 12A. At t10, step 1240 includes maintaining Vsgd_unsel=0 V (see plot 1363 in FIG. 13G at t10-t13). Step 1241 includes ramping up Vsgs from 0 V to 8 V, for example (see plot 1362 in FIG. 13G at t10-t13). Step 1242 includes ramping up Vbl_pgm from 0 V to 0.5 V (see plot 1332 in FIG. 13D at t10-t13). Step 1243 includes ramping up Vbl_inh from 0 V to 2 V (see plot 1344 in FIG. 13E at t10-t13). Step 1244 includes ramping up VWL_ds from Vrec_ds to Vverify pass (see plot 1315 in FIG. 13B at t10-t13). Step 1245 includes ramping down or up VWLn from Vrec to Vverify (see plot 1306 in FIG. 13G at t10-t11). Step 1246 includes ramping up VWL_ss from Vrec_ss to Vverify pass (see plot 1324 in FIG. 13C at t10-t13). Step 1247 includes ramping up Vsl from 0 V to 1 V (see plot 1372 in FIG. 13H at t10-t13).

The steps may be performed concurrently.

In FIG. 13A-13H, the vertical dimension denotes voltage and the horizontal dimension denotes time, with time points t0-t13. The period of time depicted corresponds to one program loop and includes a pre-charge phase 1390 (t0-t1), a program phase 1391 (t2-t4), a program recovery phase 1392 (t4-t10) and a verify phase 1392 (t10-t13).

FIG. 13A depicts voltages applied to a selected word line, WLn. A plot 1301 represents 1 V, a plot 1302 represents a program pass voltage, Vprogram pass, a plot 1303 represents a program voltage of Vpgm, a plot 1304 represents Vcc=3 V, a plot 1305 represents a recovery voltage of 4.5 V, a plot 1309 represents an optional lower recovery voltage of 3 V, and plots 1306-1308 represent example verify voltages. During the application of each verify voltage, a sensing operation occurs for the WLn memory cells assigned to the corresponding data state. A program pulse comprises the plots 1302 and 1303.

FIG. 13B depicts voltages applied to drain-side word line of WLn. A plot 1310 represents 1 V, a plot 1311 represents Vprogram pass=10 V, and a plot 1312 represents a ramp down of VWL_ds at t6 which is concurrent with the ramp down of VWL_ss, consistent with FIG. 12D. An optional plot 1313 represents an early ramp down of VWL_ds at t5 which is concurrent with FIG. 12E, step 1233a. A plot 1314 represents Vrec=4.5 V. A plot 1315 represents Vverify pass=8 V.

FIG. 13C depicts voltages applied to source-side word line of WLn. A plot 1320 represents 0 V, a plot 1321 represents Vprogram pass=10 V, and a plot 1322 represents Vrec=4.5 V. An optional plot 1323 represents a reduced Vrec=3 V which is concurrent with FIG. 12G, step 1235a. A plot 1324 represents Vverify pass=8 V.

FIG. 13D depicts voltages applied to bit lines of programmed NAND strings. A plot 1330 represents 1 V, a plot 1331 represents 0 V, and plot 1332 represents 0.5 V.

FIG. 13E depicts voltages applied to bit lines of inhibited NAND strings. A plot 1340 represents 2 V and a plot 1341 represents a ramp down of Vbl_inh from 2 V to 0 V at t8. An optional plot 1342 represents an early ramp down of Vbl_inh at t6 which is concurrent with FIG. 12F, step 1237a. A plot 1343 represents 0 V, and a plot 1344 represents 2 V.

FIG. 13F depicts voltages applied to SGD transistors of a selected sub-block. A plot 1350 represents 8 V, a plot 1351 represents 2.5 V, a plot 1352 represents 0 V and a plot 1353 represents 8 V.

FIG. 13G depicts voltages applied to SGD transistors of unselected sub-blocks and to SGS transistors. A plot 1360 represents 8 V and a plot 1361 represents 2.5 V for Vsgd_unsel and Vsgs. A plot 1362 represents 8 V for Vsgs and a plot 1363 represents 0 V for Vsgd_unsel.

FIG. 13H depicts a voltage applied to a source line. A plot 1370 represents 1 V, a plot 1371 represents 0 V and a plot 1372 represents 1 V.

In the pre-charge phase, a positive Vbl_inh (plot 1340) is provided to the drain-side channels of the inhibited NAND strings to remove residue electrons and to provide a small amount of boosting such as 1-2 V. The SGD transistors of the selected and unselected sub-blocks are in a conductive state at this time, with a voltage of 8 V, for example. This allows the bit line voltage to be passed to the drain end channel. It is also possible for the SGS transistors of the selected and unselected sub-blocks to be in a conductive state at this time, with a voltage of 8 V, for example to allow Vsl to be passed to the source end of the channel.

In the program phase, VWLn and Vwl_unsel are ramped up, e.g., starting at t2, to provide a capacitive coupling up of the channels of the inhibited NAND strings. VWLn is then ramped up further at t3 to the peak program pulse level of Vpgm and held at Vpgm until t4. After the application of the program pulse, the word line voltages are ramped down in the recovery phase. Subsequently, in the verify phase, one or more verify tests are performed by applying one or more verify voltages on WLn and, for each verify voltage, sensing the conductive state of the memory cells in the programmed NAND strings of the selected sub-block.

During the program pulse, Vsgd_sel is high enough to provide the selected SGD transistors in a conductive state for the programmed NAND strings, which receive Vbl_pgm=0 V, but low enough to provide the selected SGD transistors in a non-conductive state for the inhibited NAND strings, which receive Vbl_inh=2 V.

During the verify phase, the SGD and SGS transistors are in a strongly conductive state to allow sensing to occur for the selected memory cells.

Figure 14A:
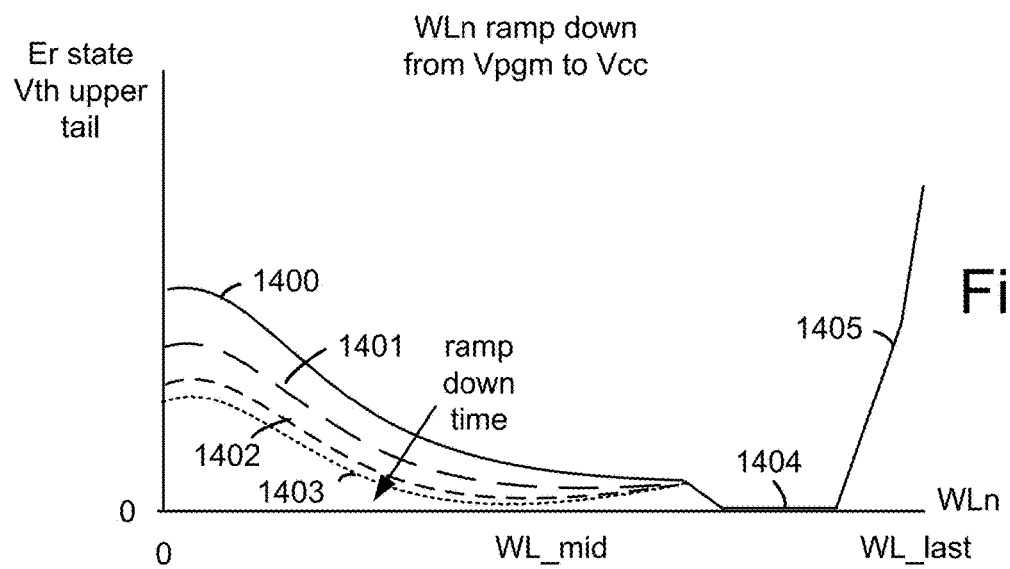
FIG. 14A depicts a plot of the Vth upper tail for Er-state memory cells as a function of the ramp down time for VWLn to transition from Vpgm to Vcc.

FIG. 14A depicts a plot of the Vth upper tail for Er-state memory cells as a function of the ramp down time for VWLn to transition from Vpgm to Vcc. The upper tail or upper edge of the Vth level is a direct component of the Vth window and Vth budget. The Vth width follows the same trend as the Vth upper tail. The x and y axes are on the same scale in FIGS. 14A and 14B. As mentioned, increasing the ramp down time of the word line voltages in the recovery phase can reduce the risk of SSI program disturb. This is demonstrated by plots 1400-1403 which have progressively larger ramp down times and correspond to progressively lower values of Vth upper tail. The data points merge at plots 1404 and 1405.

The Vth upper tail is also a function of WLn. WL0 is the source-side data word line, WL_last is the last drain-side data word line, such as WL95 in FIG. 7, and WL_mid is midway between WL0 and WL_last. For example, WL_mid can be WL48 in FIG. 7. The SSI program disturb (as measured by the Vth upper tail) occurs primarily when WLn is in the bottom half of the stack. Additionally, the program disturb is higher at WL0 than at WL_mid and increases as WLn moves closer to WL0. The increase in program disturb at higher values of WLn (plot 1405) is due to reduced channel boosting for higher word lines. For higher word lines, the portion of the channel on the drain-side of WLn becomes increasingly smaller.

Accordingly, a program disturb countermeasure as described herein can be used when WLn is in the bottom half of the stack, e.g., between the first word line, WL0 and WL_mid, and not used when WLn is in the top half of the stack, e.g., between WL_mid and the last word line. See also FIG. 16A. In another approach, the program disturb countermeasure can be relatively stronger when WLn is relatively closer to WL0.

Figure 14B:
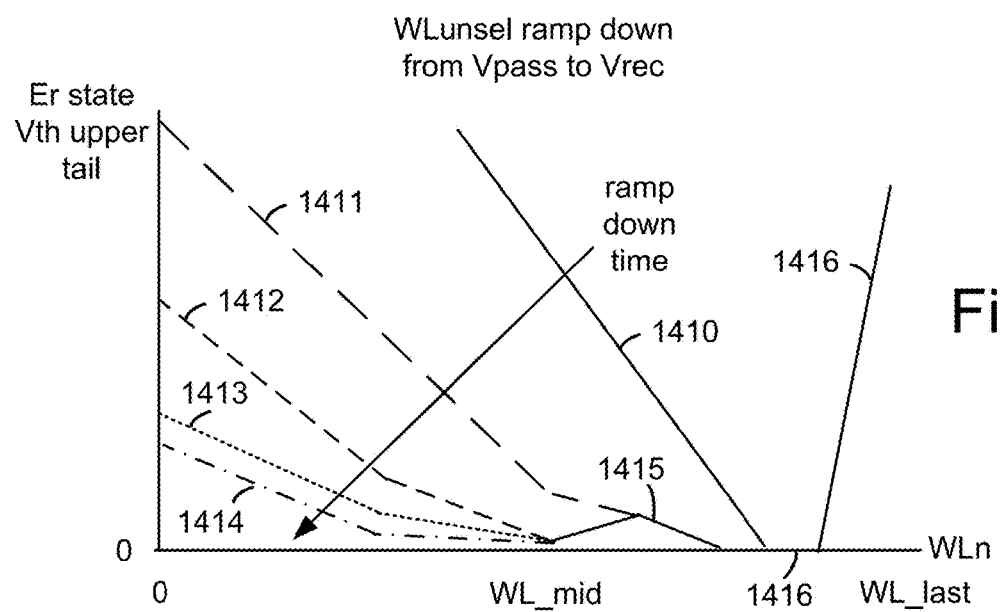
FIG. 14B depicts a plot of the Vth upper tail for Er-state memory cells as a function of the ramp down time for VWLunsel to transition from Vprogram pass to Vrecovery.

FIG. 14B depicts a plot of the Vth upper tail for Er-state memory cells as a function of the ramp down time for VWLunsel to transition from Vprogram pass to Vrecovery. The plots 1410-1415 represent progressively larger ramp down times and correspond to progressively lower values of Vth upper tail. The data points merge at plots 1415 and 1416. The Vth upper tail is also a function of WLn. As in FIG. 14A, the SSI program disturb occurs primarily when WLn is in the bottom half of the stack.

Figure 15A:
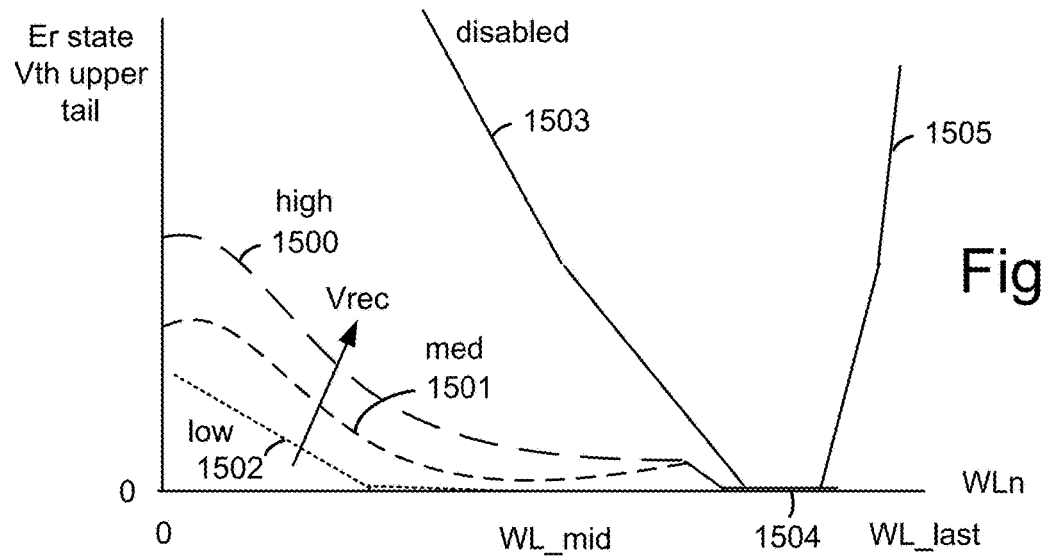
FIG. 15A depicts a plot of the Vth upper tail for Er-state memory cells versus WLn for different values of Vrecovery for the unselected word lines.

FIG. 15A depicts a plot of the Vth upper tail for Er-state memory cells versus WLn for different values of Vrecovery (Vrec) for the unselected word lines. The x axis has the same scale in FIGS. 15A and 15B. The y axis has a larger scale in FIG. 15B than FIG. 15A. FIG. 15A demonstrates that reducing Vrecovery can reduce program disturb, consistent with FIG. 12G, steps 1234a and 1235a. The plots 1500-1502 represent progressively lower values of Vrecovery, e.g., 5.2 V, 4.4 V and 3.6 V, respectively, and correspond to progressively lower values of Vth upper tail. The plot 1503 (recovery voltage disabled) represents the unselected word line voltages remaining at Vprogram pass=10 V in the recovery phase rather than being ramped down to Vrecovery<Vprogram pass. The data points merge at plots 1504 and 1505. The Vth upper tail is also a function of WLn, as discussed.

SSI program disturb is greatest when the recovery voltage is disabled because the SGD/SGS equalization pulls up the SGS bias and turns on the SGS transistor.

Figure 15B:
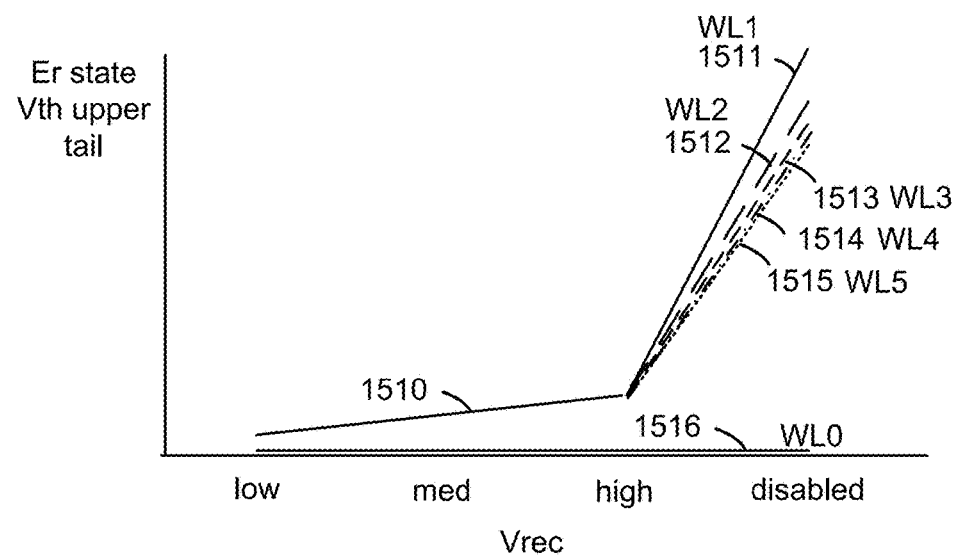
FIG. 15B depicts a plot of the Vth upper tail for Er-state memory cells versus Vrecovery for different word lines.

FIG. 15B depicts a plot of the Vth upper tail for Er-state memory cells versus Vrecovery for different word lines. Vrecovery is low, medium, high or disabled as in FIG. 15A. SSI program disturb is generally stronger when WLn is closer to the bottom of the source line, at the bottom of the stack, and when Vrecovery is higher. Specifically, the plots 1511-1515 represent progressively higher values of WLn (WL1-WL5, respectively) and corresponding progressively lower values of Vth upper tail. The data points merge at plot 1510. Plot 1516 represent the Vth upper tail when WLn=WL0. The SSI program disturb does not occur for WL0 because there is high-state (e.g., G state) memory cell in a source-side adjacent word line of WLn, so no channel gradient is formed as discussed previously which facilitates the injection of electrons into the WLn memory cell.

FIG. 16A depicts a plot of a strength of a program disturb countermeasure as a function of WLn position. As mentioned, the SSI program disturb is more likely to occur when WLn is closer to the source-side of the NAND strings, at the bottom of the stack. Accordingly, the strength of the countermeasure can be a function of WLn. A greater strength can correspond, e.g., with a longer time period allocated to the recovery phase (t4410 in FIG. 13A-13H), an earlier ramp down of VWL_ds (e.g., at t5 instead of t6 in FIG. 13B) consistent with FIG. 12E, step 1233a, an earlier ramp down of Vbl_inh (e.g., at t6 instead of t8 in FIG. 13E) consistent with FIG. 12F, step 1237a and/or a lower Vrecovery as in FIG. 12G, steps 1234a and 1235a. The strength is denoted by S1-S3 (low, medium and high strength, respectively). The value "0" denotes no countermeasure.

When WLn is between WL0 and WL_mid, a plot 1600 denotes using a fixed strength of S2 and a plot 1602 denotes using an increasing strength as WLn is increasingly closer to WL0. When WLn is between WL_mid and WL_last, a plot 1601 denotes using a fixed, low strength of S1<S2 and a plot 1603 denotes using no countermeasure.

FIG. 16B depicts a plot of a strength of a program disturb countermeasure as a function of Vpgm, program loop (PL) number, P-E cycles and temperature. A higher Vpgm or corresponding PL number results in a higher channel boosting for the inhibited NAND strings and therefore a greater risk of SSI program disturb. This is because a higher channel voltage results in a stronger attraction of the electrons from the source line. Accordingly, when Vpgm is less than a threshold Vpgm_th or PL is less than a threshold PL_th, a plot 1610 represents a fixed, low strength of S1 or a plot 1613 denotes using no countermeasure. When Vpgm>=Vpgm_th or PL>=PL_th, a plot 1611 denotes using a fixed strength of S2 or a plot 1612 denotes using an increasing strength as Vpgm or PL increases.

A higher number of P-E cycles also results in a greater risk of SSI program disturb because the cycling results in degradation of the memory cells which makes them easier to program. Accordingly, when P-E is less than a threshold P-E_th, the plot 1610 represents a fixed, low strength of S1 or a plot 1613 denotes using no countermeasure. When P-E>=P-E_th the plot 1611 denotes using a fixed strength of S2 or the plot 1612 denotes using an increasing strength as P-E increases.

SSI program disturb is also more likely to occur at higher temperatures because the electrons have more energy. Accordingly, when Temp. is less than a threshold Temp_th, the plot 1610 represents a fixed, low strength of S1 or a plot 1613 denotes using no countermeasure. When Temp>=Temp_th the plot 1611 denotes using a fixed strength of S2 or the plot 1612 denotes using an increasing strength as Temp. increases.

In one implementation, a time period by which the voltage of the drain-side word lines is reduced from the respective pass voltage to the respective recovery voltage before the voltage of the source-side word lines is reduced from the respective pass voltage to the respective recovery voltage is relatively large when a risk of program disturb is relatively large. The risk of program disturb can be relatively large when Vpgm, PL, P-E cycles and/or Temp. are relatively large, and/or when WLn is relatively close to the source-side or bottom of the stack. The risk of program disturb can be relatively large when Vpgm>Vpgm_th, PL>PL_th, P-E cycles>P-E_th and/or Temp.>Temp_th.

In another implementation, a time period by which the voltage of the respective bit lines of the inhibited NAND strings is reduced from the respective positive voltage to the respective recovery voltage before the voltage of the select gate transistors at the drain ends of the inhibited NAND strings is reduced from the respective positive voltage to the respective recovery voltage is relatively large when a risk of program disturb is relatively large.

In another implementation, a control circuit is configured to allocate a relatively large time period in which the voltage of the selected word line is reduced from the program voltage to the respective recovery voltage when the program voltage is relatively greater.

In another implementation, a time period by which the voltage of the drain-side word lines is reduced from the respective pass voltage to the respective recovery voltage before the voltage of the source-side word lines is reduced from the respective pass voltage to the respective recovery voltage is relatively large when a temperature of the block is above a temperature threshold than when the temperature of the block is not above the temperature threshold.

In another implementation, a time period by which the voltage of the drain-side word lines is reduced from the respective pass voltage to the respective recovery voltage before the voltage of the source-side word lines is reduced from the respective pass voltage to the respective recovery voltage is larger when the program voltage is above a program voltage threshold than when the program voltage is not above the program voltage threshold.

Accordingly, it can be see that in one implementation, an apparatus comprises: a set of memory cells arranged in NAND strings in a block, each NAND string comprising a select gate transistor at a source end and a select gate transistor at a drain end; a source line connected to the source ends of the NAND strings; a plurality of word lines connected to the set of memory cells and comprising a selected word line, drain-side word lines of the selected word line and source-side word lines of the selected word line; and a control circuit configured to, in a program loop of a program operation: perform a program phase in which a voltage of the selected word line is set to a program voltage, a voltage of the drain-side word lines is set to a respective pass voltage, a voltage of the source-side word lines is set to a respective pass voltage, and a voltage of the source line is set to a respective positive voltage; and after the program phase, perform a recovery phase in which the voltage of the selected word line is reduced from the program voltage to a respective recovery voltage, after which the voltage of the drain-side word lines is reduced from the respective pass voltage to a respective recovery voltage and the voltage of the source-side word lines is reduced from the respective pass voltage to a respective recovery voltage, after which the voltage of the source line is reduced from the respective positive voltage to a respective recovery voltage.

In another implementation, a method comprises: (a) in a program phase of a program operation; setting a voltage of a selected word line in a block to a program voltage, the block comprises a set of memory cells arranged in NAND strings, each NAND string comprising a source end and a drain end; setting a voltage of source-side word lines of the selected word line to a respective pass voltage; setting a voltage of drain-side word lines of the selected word line to a respective pass voltage; and setting a voltage of a source line of the block to a respective positive voltage, the source line is connected to the source ends of the NAND strings; (b) in recovery phase of the program operation: reducing the voltage of the selected word line from the program voltage to a respective recovery voltage; then reducing the voltage of the drain-side word lines from the respective pass voltage to a respective recovery voltage; then reducing the voltage of the source-side word lines from the respective pass voltage to a respective recovery voltage; and then reducing the voltage of the source line from the respective positive voltage to a respective recovery voltage; and (c) performing a verify phase of the program operation after the recovery phase.

In another implementation, an apparatus comprises: a set of memory cells arranged in NAND strings in a block, each NAND string comprising a source end and a drain end, and a select gate transistor at the drain end, the NAND strings are connected to respective bit lines and the NAND strings comprise inhibited NAND strings and programmed NAND strings; a source line connected to the source ends of the NAND strings; a plurality of word lines connected to the set of memory cells and comprising a selected word line and unselected word lines; and a control circuit configured to, in a program loop of a program operation: perform a program phase in which a voltage of the selected word line is set to a program voltage, and a voltage of the unselected word lines is set to a respective pass voltage, a voltage of respective bit lines of the inhibited NAND strings is set to a respective positive voltage, and a voltage of the select gate transistors of the inhibited NAND strings is set to a respective positive voltage; and after the program phase, perform a recovery phase in which the voltage of the selected word line is reduced from the program voltage to a respective recovery voltage, the voltage of the unselected word lines is reduced from the respective pass voltage to a respective recovery voltage, and the voltage of the respective bit lines of the inhibited NAND strings is reduced from the respective positive voltage to a respective recovery voltage before a voltage of the select gate transistors of the inhibited NAND strings is reduced from the respective positive voltage to a respective recovery voltage.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
a set of memory cells arranged in NAND strings in a block, each NAND string comprising a select gate transistor at a source end and a select gate transistor at a drain end;
a source line connected to the source ends of the NAND strings;
a plurality of word lines connected to the set of memory cells and comprising a selected word line, drain-side word lines of the selected word line and source-side word lines of the selected word line; and
a control circuit connected to the source line and the plurality of word lines, the control circuit is configured to, in a program loop of a program operation:
perform a program phase in which a voltage of the selected word line is set to a program voltage, a voltage of the drain-side word lines is set to a respective pass voltage, a voltage of the source-side word lines is set to a respective pass voltage, and a voltage of the source line is set to a respective positive voltage; and
after the program phase, perform a recovery phase in which the voltage of the selected word line is reduced from the program voltage, after which the voltage of the drain-side word lines is reduced from the respective pass voltage to a respective recovery voltage, after which the voltage of the source-side word lines is reduced from the respective pass voltage to a respective recovery voltage, after which the voltage of the source line is reduced from the respective positive voltage to a respective recovery voltage, wherein the voltage of the drain-side word lines is reduced and the voltage of the source-side word lines is reduced while applying the respective positive voltage to the source line and applying, to the select gate transistors at the source end of the NAND strings, a voltage which is less than the respective positive voltage applied to the source line.

2. The apparatus of claim 1, wherein:
a time period by which the voltage of the drain-side word lines is reduced from the respective pass voltage to the respective recovery voltage before the voltage of the source-side word lines is reduced from the respective pass voltage to the respective recovery voltage is relatively large when a risk of program disturb is relatively large.

3. The apparatus of claim 2, wherein:
the risk of program disturb is relatively large when a temperature of the block is relatively higher.

4. The apparatus of claim 2, wherein:
the risk of program disturb is relatively large when the program voltage is relatively higher.

5. The apparatus of claim 2, wherein:
the NAND strings extend vertically in a stack; and
the risk of program disturb is relatively large when the selected word line is in a bottom half of the stack than when the selected word line is in a top half of the stack.

6. The apparatus of claim 1, wherein:
in the recovery phase, the respective recovery voltage of the source-side word lines is lower than the respective recovery voltage of the drain-side word lines.

7. The apparatus of claim 6, wherein:
an amount by which the respective recovery voltage of the source-side word lines is lower than the respective pass voltage of the drain-side word lines is relatively large when a risk of program disturb is relatively large.

8. The apparatus of claim 1, wherein:
in the recovery phase, a voltage of the selected word line is lower than the respective recovery voltage of the drain-side word lines.

9. The apparatus of claim 1, wherein:
the NAND strings are connected to respective bit lines;
in the program loop, the NAND strings comprise inhibited NAND strings and programmed NAND strings; and
the control circuit, in the program phase, is configured to set a voltage of respective bit lines of the inhibited NAND strings at a respective positive voltage, and in the recovery phase, is configured to reduce the voltage of the respective bit lines of the inhibited NAND strings from the respective positive voltage to a respective recovery voltage before a voltage of the select gate transistors at the drain ends of the inhibited NAND strings is reduced from a respective positive voltage to a respective recovery voltage.

10. The apparatus of claim 9, wherein:
the control circuit, in the recovery phase, is configured to reduce the voltage of the respective bit lines of the inhibited NAND strings from the respective positive voltage to the respective recovery voltage after reducing the voltage of the selected word line from the program voltage to the respective recovery voltage.

11. The apparatus of claim 1, wherein:
the control circuit is configured to allocate a relatively long time period to the recovery phase when the program voltage is relatively greater.

12. A method, comprising:
in a program phase of a program operation;

setting a voltage of a selected word line in a block to a program voltage, the block comprises a set of memory cells arranged in NAND strings, each NAND string comprising a source end and a drain end;

setting a voltage of source-side word lines of the selected word line to a respective pass voltage;

setting a voltage of drain-side word lines of the selected word line to a respective pass voltage; and setting a voltage of a source line of the block to a respective positive voltage, the source line is connected to the source ends of the NAND strings;

in recovery phase of the program operation:

reducing the voltage of the selected word line from the program voltage;

after the reducing of the voltage of the selected word line, reducing the voltage of the drain-side word lines from the respective pass voltage to a respective recovery voltage;

after the reducing of the voltage of the drain-side word lines, reducing the voltage of the source-side word lines from the respective pass voltage to a respective recovery voltage; and after the reducing the voltage of the source-side word lines, reducing the voltage of the source line from the respective positive voltage to a respective recovery voltage; and performing a verify phase of the program operation after the recovery phase.

13. The method of claim 12, further comprising:

a time period by which the voltage of the drain-side word lines is reduced from the respective pass voltage to the respective recovery voltage before the voltage of the source-side word lines is reduced from the respective pass voltage to the respective recovery voltage is relatively large when a temperature of the block is above a temperature threshold than when the temperature of the block is not above the temperature threshold.

14. The method of claim 12, further comprising:

a time period by which the voltage of the drain-side word lines is reduced from the respective pass voltage to the respective recovery voltage before the voltage of the source-side word lines is reduced from the respective pass voltage to the respective recovery voltage is larger when the program voltage is above a program voltage threshold than when the program voltage is not above the program voltage threshold.

15. An apparatus, comprising:

a set of memory cells arranged in NAND strings, each NAND string comprising a source end and a drain end, and a select gate transistor at the drain end, the NAND strings are connected to respective bit lines and the NAND strings comprise inhibited NAND strings and programmed NAND strings;

a source line connected to the source ends of the NAND strings;

a plurality of word lines connected to the set of memory cells and comprising a selected word line and unselected word lines; and a control circuit configured to, in a program loop of a program operation:

perform a program phase in which a voltage of the selected word line is set to a program voltage, and a voltage of the unselected word lines is set to a respective pass voltage, a voltage of respective bit lines of the inhibited NAND strings is set to a respective positive voltage, and a voltage of the select gate transistors of the inhibited NAND strings is set to a respective positive voltage; and after the program phase, perform a recovery phase in which the voltage of the selected word line is reduced from the program voltage to a respective reduced voltage, the voltage of the unselected word lines is reduced from the respective pass voltage to a respective recovery voltage, and the voltage of the respective bit lines of the inhibited NAND strings is reduced from the respective positive voltage to a respective recovery voltage before a voltage of the select gate transistors of the inhibited NAND strings is reduced from the respective positive voltage to a respective recovery voltage, wherein a time period by which the voltage of the respective bit lines of the inhibited NAND strings is reduced from the respective positive voltage to the respective recovery voltage before the voltage of the select gate transistors of the inhibited NAND strings is reduced from the respective positive voltage to the respective recovery voltage is relatively large when a risk of program disturb is relatively large.

16. The apparatus of claim 15 wherein:

the voltage of the respective bit lines of the inhibited NAND strings is reduced from the respective positive voltage to the respective recovery voltage concurrent with the voltage of the unselected word lines being reduced from the respective pass voltage to the respective recovery voltage.

17. The apparatus of claim 1, wherein:

the voltage of the selected word line is reduced from the program voltage to a power supply voltage in the recovery phase.

18. The method of claim 12, wherein:

after the voltage of the selected word line is reduced from the program voltage, the voltage of the selected word line is increased when the voltage of the source-side word lines is reduced from the respective pass voltage to the respective recovery voltage.

19. The method of claim 12, wherein:

the voltage of the selected word line in the recovery phase is different than a verify voltage of the selected word line at a start of the verify phase.

20. The method of claim 12, wherein a select gate transistor is provided at the source end of each NAND string, the method further comprising:

applying a back bias to the select gate transistors during the reducing of the voltage of the drain-side word lines and the reducing of the voltage of the source-side word lines.

21. An apparatus, comprising:

a circuit configured to connect to a source line and a plurality of word lines, the plurality of word lines are connected to a set of memory cells and comprise a selected word line, drain-side word lines of the selected word line and source-side word lines of the selected word line, the set of memory cells are arranged in NAND strings, the source line is connected to source ends of the NAND strings, and the circuit is configured to, in a program loop of a program operation:

perform a program phase in which a voltage of the selected word line is set to a program voltage, a voltage of the drain-side word lines is set to a respective pass voltage, a voltage of the source-side word lines is set to a respective pass voltage, and a voltage of the source line is set to a respective positive voltage; and after the program phase, perform a recovery phase in which the voltage of the selected word line is reduced from the program voltage, after which the voltage of the drain-side word lines is reduced from the respective pass voltage to a respective recovery voltage and the voltage of the source-side word lines is reduced from the respective pass voltage to a respective recovery voltage, after which the voltage of the source line is reduced from the respective positive voltage to a respective recovery voltage, wherein the voltage of the selected word line in the recovery phase is different than a verify voltage of the selected word line at a start of a verify phase of the program loop which follows the recovery phase.

22. The apparatus of claim 21, wherein:
the reducing of the voltage of the drain-side word lines is before the reducing of the voltage of the source-side word lines.

23. The apparatus of claim 21, wherein:
the circuit is configured to apply a back bias to select gate transistors at the source ends of the NAND strings during the reducing of the voltage of the drain-side word lines and the reducing of the voltage of the source-side word lines.

* * * * *